(12) United States Patent
Sasaki et al.

(10) Patent No.: US 8,409,939 B2
(45) Date of Patent: Apr. 2, 2013

(54) SEMICONDUCTOR DEVICE AND METHOD FOR FABRICATING THE SAME

(75) Inventors: Yuichiro Sasaki, Osaka (JP); Katsumi Okashita, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 282 days.

(21) Appl. No.: 12/944,224

(22) Filed: Nov. 11, 2010

(65) Prior Publication Data

US 2011/0147813 A1    Jun. 23, 2011

(30) Foreign Application Priority Data

Dec. 17, 2009 (JP) ................................. 2009-286277

(51) Int. Cl.
*H01L 21/00* (2006.01)
*H01L 21/84* (2006.01)

(52) U.S. Cl. ....................... 438/164; 438/513

(58) Field of Classification Search .................. 438/513, 438/164
See application file for complete search history.

(56) References Cited

U.S. PATENT DOCUMENTS

| 4,912,065 A | 3/1990 | Mizuno et al. |
| 2006/0157749 A1 | 7/2006 | Okuno |
| 2007/0166846 A1 | 7/2007 | Sasaki et al. |
| 2011/0049628 A1 * | 3/2011 | Okumura et al. ............. 257/347 |
| 2011/0272763 A1 * | 11/2011 | Sasaki et al. .................. 257/347 |
| 2012/0034750 A1 * | 2/2012 | Sasaki et al. .................. 438/306 |

FOREIGN PATENT DOCUMENTS

| JP | 01-295416 | 11/1989 |
| JP | 2006-196821 | 7/2006 |
| WO | WO 2006/064772 A1 | 6/2006 |

OTHER PUBLICATIONS

Lenoble, D., et al., "Enhanced performance of PMOS MUGFET via integration of conformal plasma-doped source/drain extensions", 2006 Symposium on VLSI Technology Digest of Techincal Papers, p. 212.

* cited by examiner

*Primary Examiner* — Thien F Tran
(74) *Attorney, Agent, or Firm* — McDermott Will & Emery LLP

(57) ABSTRACT

A method for fabricating a semiconductor device includes: forming a fin-type semiconductor region on a substrate; and introducing an n-type impurity into at least a side of the fin-type semiconductor region by a plasma doping process, thereby forming an n-type impurity region in the side of the fin-type semiconductor region. In the introducing the n-type impurity, when a source power in the plasma doping process is denoted by a character Y [W], the supply of a gas containing the n-type impurity per unit time and per unit volume is set greater than or equal to $5.1 \times 10^{-8}/((1.7^{2.51}/2^{4.51}) \times (Y/500))$ [mol/(min·L·sec)], and the supply of a diluent gas per unit time and per unit volume is set greater than or equal to $1.7 \times 10^{-4}/((20^{2.51}/2^{4.51}) \times (Y/500))$ [mol/(min·L·sec)].

11 Claims, 13 Drawing Sheets

Before Plasma Doping
Radius of Curvature: 9.30nm

Condition D (After Annealing)
Radius of Curvature: 10.49nm

Condition E (After Annealing)
Radius of Curvature: 11.31nm

Condition F (After Annealing)
Radius of Curvature: 15.01nm

FIG.12

| | Supply of AsH₃ Molecules Per Unit Time And Per unit Volume (mol/min·L·sec) | Top Surface | | Side Surface | Erosion (nm) |
|---|---|---|---|---|---|
| | | Sheet Resistance (Ω/sq.) | Spreading Resistance (Ω) | Spreading Resistance (Ω) | |
| E | $9.20 \times 10^{-8}$ | 500 | $1.1 \times 10^4$ | $3.3 \times 10^4$ | 2.0 |
| I | $9.25 \times 10^{-7}$ | 340 | $3.0 \times 10^3$ | $7.5 \times 10^3$ | 1.2 |
| J | $1.86 \times 10^{-6}$ | 342 | $3.6 \times 10^3$ | $9.1 \times 10^3$ | 1.5 |
| K | $5.68 \times 10^{-6}$ | 345 | $2.6 \times 10^3$ | $8.1 \times 10^3$ | 3.7 |
| L | $9.66 \times 10^{-6}$ | Unstable | Not Measured | Not Measured | Not Measured |

SEMICONDUCTOR DEVICE AND METHOD FOR FABRICATING THE SAME

CROSS-REFERENCE TO RELATED APPLICATION

This application claims priority to Japanese Patent Application No. 2009-286277 filed on Dec. 17, 2009, the disclosure of which including the specification, the drawings, and the claims is hereby incorporated by reference in its entirety.

BACKGROUND

The present disclosure relates to semiconductor devices and methods for fabricating the same, and more particularly relates to a semiconductor device having a three-dimensional structure and including a fin-shaped semiconductor region on a substrate.

In recent years, with increases in the degree of integration, functionality, and speed of semiconductor devices, there is an increasing demand for miniaturization of semiconductor devices. To meet the demand, various device structures have been proposed for reducing the area occupied by transistors over a substrate. Among them, a field effect transistor having a tin-type structure has drawn attention. The field effect transistor having the fin-type structure is generally called a fin field effect transistor (fin-FET), and has an active region made of a semiconductor region (hereinafter referred to as a fin-type semiconductor region) having a thin-wall (fin) shape perpendicular to the principal surface of a substrate. In the fin-FET, the side surfaces of the fin-type semiconductor region can be used as channel surfaces, and accordingly the area occupied by transistors over the substrate can be reduced (see, e.g., Japanese Patent Publication No. 2006-196821 and D. Lenoble et al., "Enhanced performance of PMOS MUG-FET via integration of conformal plasma-doped source/drain extensions," 2006 Symposium on VLSI Technology Digest of Technical Papers, p. 212).

In Japanese Patent Publication No. 2006-196821, a technique has been proposed in which ions are implanted into a fin-type silicon region from oblique directions, thereby forming extension regions and high-concentration impurity regions which serve as source/drain regions. When, e.g., an impurity region is formed by such ion implantation from oblique directions, ions are implanted into side portions of the fin-type silicon region from one direction while ions are implanted into an upper portion of the fin-type silicon region from two directions. This allows the implant dose of an impurity region in the upper portion of the fin-type silicon region to be twice as large as the implant dose of an impurity region in each of the side portions of the fin-type silicon region. In other words, it is difficult to form a low-resistance impurity region in the side portion of the fin-type silicon region.

Therefore, in recent years, attention has been drawn to the use of plasma doping in order to dope the side surfaces of a fin-type semiconductor region with impurities.

A pulsed DC plasma technique has been proposed, as a plasma doping technique for forming an impurity region of a fin-FET, in D. Lenoble et al., "Enhanced performance of PMOS MUGFET via integration of conformal plasma-doped source/drain extensions," 2006 Symposium on VLSI Technology Digest of Technical Papers, p. 212. In the pulsed DC plasma technique, a plasma is generated intermittently, and thus, this technique has an advantage in that etching of a fin-type semiconductor region can be reduced.

A plasma doping technique using an inductively coupled plasma (ICP) method has been proposed, as a plasma doping technique for forming an impurity region of a fin-FET, in WO 2006/064772. The ICP method has an advantage in that the surface of a large substrate, such as a wafer having a diameter of 300 mm, can be uniformly doped by employing a longer time range (doping time) than that used in a pulsed DC plasma method.

Japanese Patent Publication No. H01-295416 describes a plasma doping technique for doping the trench side surface, although it is not an object of the technique to subject the side surfaces of a narrow and fine fin-type semiconductor region to plasma doping.

SUMMARY

As described above, the use of various plasma doping techniques has been proposed in order to dope the side surfaces of a fin-type semiconductor region with impurities.

However, when n-type impurities, such as arsenic (As), are to be introduced into the side surfaces of a fine fin-type semiconductor region, a low-resistance n-type impurity region cannot be formed in each of the side surfaces of the fin-type semiconductor region because such n-type impurities have poor adherence to the fin-type semiconductor region. This prevents an n-type fin-FET having desired characteristics from being obtained.

It is extremely difficult to use a method in which the side surface of a trench of large dimensions is doped as described in Japanese Patent Publication No. H01-295416 to form an impurity region of a fin-FET. The reason for this will be described below. Specifically, in such a plasma doping method for the trench side surface, no consideration is given to critical technical problems in the formation of a fin-FET, such as amorphization of a fin-type semiconductor region, and chipping of the upper corners of the fin-type semiconductor region. This causes a problem where large part of the fin-type semiconductor region is made amorphous, thereby making it difficult to recover crystals even after annealing, and a problem where the upper corners of the fin-type semiconductor region are significantly chipped. Consequently, even when such a plasma doping method for the trench side surface is used in order to introduce n-type impurities into side portions of a narrow and fine fin-type semiconductor region, and the n-type impurities are electrically activated by annealing, a low-resistance impurity region cannot be formed.

In view of the above, it is an object of the present disclosure to allow a low-resistance n-type impurity region to be formed by introducing n-type impurities into side surfaces of a fin-type semiconductor region, thereby achieving an n-type fin semiconductor device having desired characteristics.

In order to achieve the above object, a method for fabricating a semiconductor device according to the present disclosure includes: forming a fin-type semiconductor region on a substrate; and introducing an n-type impurity into at least a side of the fin-type semiconductor region by a plasma doping process, thereby forming an n-type impurity region in the side of the fin-type semiconductor region. In the introducing the n-type impurity, when a source power in the plasma doping process is denoted by a character Y [W], a supply of a gas containing the n-type impurity per unit time and per unit volume is set greater than or equal to $5.1 \times 10^{-8}/((1.7^{2.51}/2^{4.51}) \times (Y/500))$ [mol/(min·L·sec)], and a supply of a diluent gas per unit time and per unit volume is set greater than or equal to $1.7 \times 10^{-4}/((20^{2.51}/2^{4.51}) \times (Y/500))$ [mol/(min·L·sec)].

Influences of parameters other than the source power, such as the bias voltage, on the relationship between the supply of the gas containing the n-type impurity or the diluent gas per unit time and per unit volume and the resistance of the n-type impurity region formed in the side of the fin-type semiconductor region are substantially negligible. Parameters indicating the substrate temperature, etc., are substantially fixed. For example, the substrate temperature is usually fixed at approximately room temperature. Therefore, the influence of such parameters does not practically need to be considered.

In the method of the present disclosure, in the introducing the n-type impurity, the supply of the gas containing the n-type impurity per unit time and per unit volume may be set greater than or equal to $7 \times 10^{-8}/((1.7^{2.51}/2^{4.51}) \times (Y/500))$ [mol/(min·L·sec)], and the supply of the diluent gas per unit time and per unit volume may be set greater than or equal to $1.7 \times 10^{-3}/((20^{2.51}/2^{4.51}) \times (Y/500))$ [mol/(min·L·sec)]. In this case, in the introducing the n-type impurity, the supply of the gas containing the n-type impurity per unit time and per unit volume may be set greater than or equal to $8.7 \times 10^{-8}/((1.7^{2.51}/2^{4.51}) \times (Y/500))$ [mol/(min·L·sec)], and the supply of the diluent gas per unit time and per unit volume may be set greater than or equal to $3.4 \times 10^{-3}/((20^{2.51}/2^{4.51}) \times (Y/500))$ [mol/(min·L·sec)].

In the method of the present disclosure, in the introducing the n-type impurity, the supply of the gas containing the n-type impurity per unit time and per unit volume may be set less than $9.66 \times 10^{-6}/((1.7^{2.51}/2^{4.51}) \times (Y/500))$ [mol/(min·L·sec)].

In the method of the present disclosure, in the introducing the n-type impurity, a chamber volume may be greater than or equal to 30 liters and less than 65 liters, and the supply of the diluent gas per unit time and per unit volume may be set less than or equal to $3 \times 10^{-2}/((20^{2.51}/2^{4.51}) \times (Y/500))$ [mol/(min·L·sec)]. When a triple gate fin-type semiconductor device is fabricated, the supply of the diluent gas per unit time and per unit volume is preferably set less than or equal to $2.7 \times 10^{-2}/((20^{2.51}/2^{4.51}) \times (Y/500))$ [mol/(min·L·sec)].

In the method of the present disclosure, in the introducing the n-type impurity, a chamber volume may be greater than or equal to 65 liters and less than or equal to 100 liters, and the supply of the diluent gas per unit time and per unit volume may be set less than or equal to $4.66 \times 10^{-3}/((20^{2.51}/2^{4.51}) \times (Y/500))$ [mol/(min·L·sec)]. When a triple gate fin-type semiconductor device is fabricated, the supply of the diluent gas per unit time and per unit volume is preferably set less than or equal to $3.8 \times 10^{-3}/((20^{2.51}/2^{4.51}) \times (Y/500))$ [mol/(min·L·sec)].

In the method of the present disclosure, in the introducing the n-type impurity, a pressure during the plasma doping process may be set less than or equal to 0.6 Pa. When a double gate fin semiconductor device is fabricated, an upper portion of the fin-type semiconductor region is covered with a hard mask, thereby relaxing restrictions on chipping (in some cases, hereinafter referred to as erosion) of upper corners of the fin-type semiconductor region due to plasma doping. Therefore, the pressure during plasma doping may be higher than 0.6 Pa. Furthermore, when the method of the present disclosure is used to form a source/drain region, the pressure during plasma doping can be increased to higher than 0.6 Pa by performing a process in which the size of a portion of the fin-type semiconductor region corresponding to the source/drain region is increased, etc., even with a triple gate fin semiconductor device.

In the method of the present disclosure, the gas containing the n-type impurity may be $AsH_3$. A gas containing, e.g., phosphorus (P) may be used instead of the gas containing arsenic (As) as the n-type impurity, such as $AsH_3$.

In the method of the present disclosure, the diluent gas may be He. For example, instead of He, hydrogen ($H_2$) or neon (Ne) may be used as the diluent gas.

In the method of the present disclosure, the n-type impurity region may be an extension region or a source/drain region.

In the method of the present disclosure, a width of the fin-type semiconductor region along a gate width may be less than or equal to 15 nm.

A semiconductor device according to the present disclosure includes: a fin-type semiconductor region formed on a substrate; and an n-type impurity region formed in a side of the fin-type semiconductor region. A spreading resistance of the n-type impurity region is less than $9.0 \times 10^4 \Omega$.

In the semiconductor device of the present disclosure, the spreading resistance of the n-type impurity region may be less than or equal to $6.3 \times 10^4 \Omega$. In this case, the spreading resistance of the n-type impurity region may be less than or equal to $3.6 \times 10^4 \Omega$.

In the semiconductor device of the present disclosure, the n-type impurity region may contain As. The n-type impurity region may contain P instead of As.

In the semiconductor device of the present disclosure, the n-type impurity region may be an extension region, and a gate electrode may be formed to cover a part of the fin-type semiconductor region adjacent to the n-type impurity region.

In the semiconductor device of the present disclosure, the n-type impurity region may be a source/drain region, a gate electrode may be formed to cover a part of the fin-type semiconductor region apart from the n-type impurity region, and an insulative sidewall spacer may be formed to cover a side of the gate electrode and a portion of the fin-type semiconductor region located between the n-type impurity region and the gate electrode.

In the semiconductor device of the present disclosure, a width of the fin-type semiconductor region along a gate width may be less than or equal to 15 nm.

According to the present disclosure, a low-resistance n-type impurity region can be formed by introducing an n-type impurity into a side of a fin-type semiconductor region, thereby achieving an n-type fin semiconductor device having desired characteristics.

As described above, the present disclosure relates to semiconductor devices and methods for fabricating the same, and is preferable for, in particular, a semiconductor device having a three-dimensional structure and including a fin-type semiconductor region on a substrate, and a method for fabricating the same.

BRIEF DESCRIPTION OF THE DRAWINGS

FIGS. 6A-6C are diagrams illustrating the structure of a semiconductor device according to the example embodiment, in which FIG. 6A is a plan view of the semiconductor device, FIG. 6B is a cross-sectional view taken along the line A-A in FIG. 6A, and FIG. 6C is a cross-sectional view taken along the line B-B in FIG. 6A.

FIG. 12 is a table collectively illustrating various plasma doping conditions and results obtained using the plasma doping conditions.

DETAILED DESCRIPTION

Setting of Target Spreading Resistance of Fin Side Surface

Before describing an example embodiment, the results obtained after the present inventors investigated the relationship between the spreading resistance and sheet resistance of the top surface of a fin-type semiconductor region (hereinafter referred to as the fin top surface) when plasma doping is performed, and the arsenic (As) implantation profile will be described, and it will be shown that the target spreading resistance of a side surface of a fin-type semiconductor region (hereinafter referred to as a fin side surface) can be set based on these results. Note that unless otherwise specified, the spreading resistance, the sheet resistance, and the As implantation profile were measured using SSRM (2D scanning spreading resistance microscopy), a four-point probe technique, and secondary ion mass spectrometry (SIMS), respectively.

Figure 1:
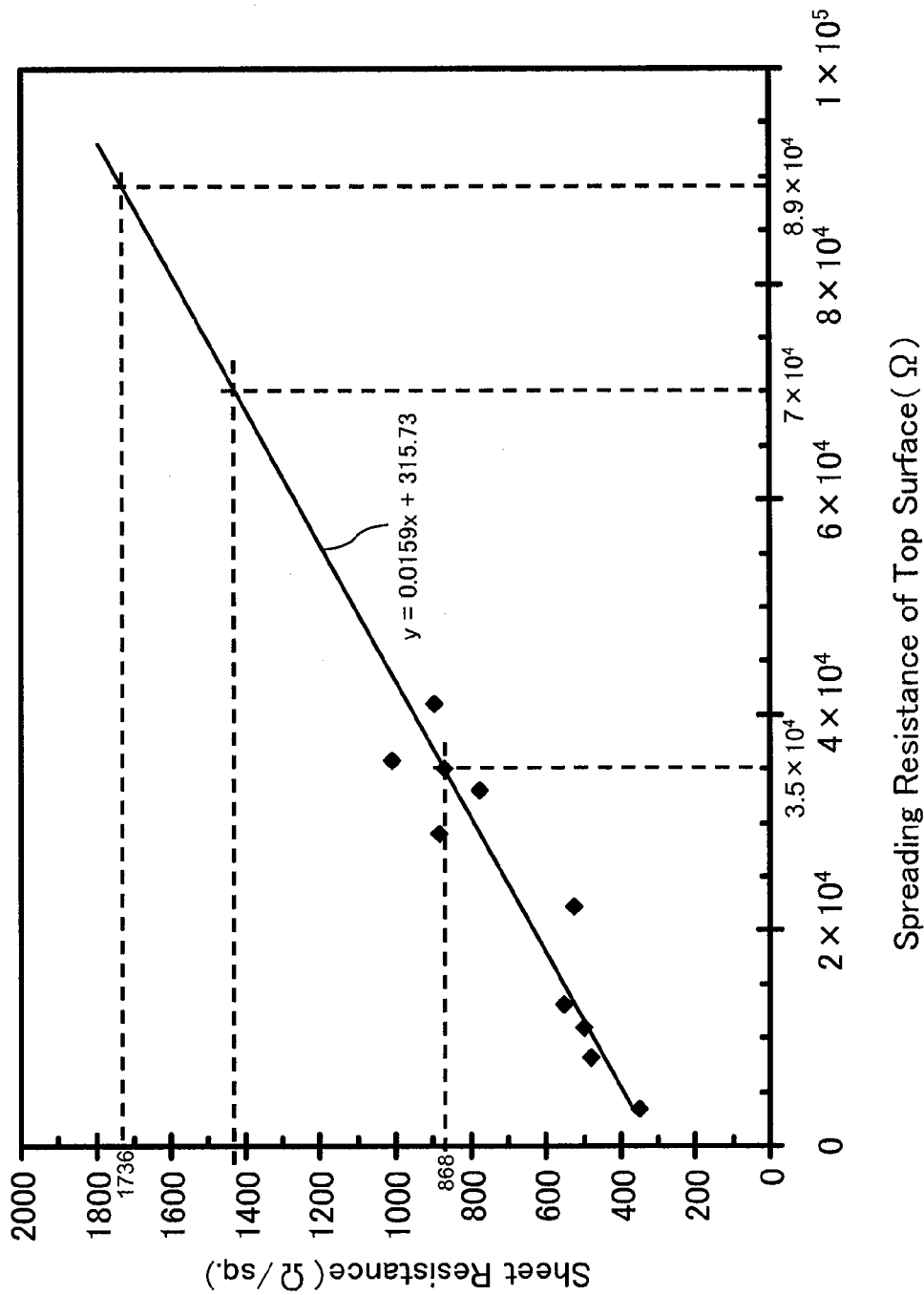
FIG. 1 is a graph illustrating the relationship between the spreading resistance of the fin top surface of each of samples measured by scanning spreading resistance microscopy (SSRM), and the sheet resistance measured on a bare substrate (single crystal silicon substrate) processed under the same condition as the sample subjected to SSRM by a four-point probe technique.

FIG. 1 illustrates the relationship between the spreading resistance of the fin top surface of each of samples measured by SSRM, and the sheet resistances measured on a bare substrate (single crystal silicon substrate) processed under the same condition as the sample subjected to SSRM by a four-point probe technique. Arsenic in each of the samples subjected to SSRM and the samples subjected to the four-point probe technique was electrically activated in monocrystals of silicon under the same annealing conditions (by spike rapid thermal annealing (RTA) at 1025° C.).

As illustrated in FIG. 1, there is a strong correlation between the spreading resistance of the fin top surface and the sheet resistance of the corresponding bare substrate (y=0.0159·x+315.73 where the spreading resistance is denoted by the character x, and the sheet resistance is denoted by the character y). A possible reason for this is that since the resistances were compared to each other in a situation where the diffusion depths were approximately equal under the same annealing conditions, a reduction in the sheet resistance was effected by a reduction in resistivity (i.e., the spreading resistance).

Figure 2:
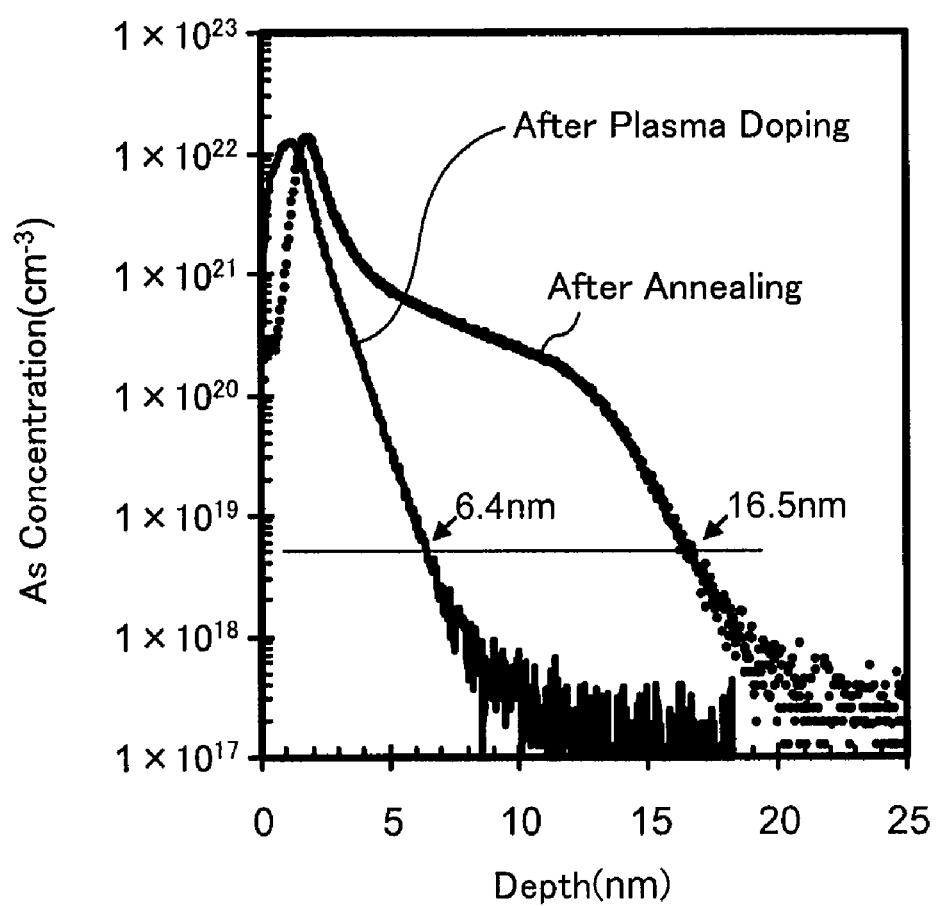
FIG. 2 is a graph illustrating the As profile immediately after implantation of As into a bare substrate by plasma doping, and the As profile after subsequent annealing.

FIG. 2 illustrates the As profile immediately after As is implanted into a bare substrate by plasma doping, and the As profile after subsequent annealing.

As illustrated in FIG. 2, the profile immediately after plasma doping shows that the implantation depth (the depth at which the As concentration immediately after plasma doping is $5\times10^{18}$ cm$^{-3}$) is 6.4 nm. By contrast, the profile after annealing shows that the junction depth Xj (the depth at which the As concentration after annealing is $5\times10^{18}$ cm$^{-3}$) is 16.5 nm. It can be seen from the above that the impurity diffusion length in annealing (the distance to which impurities are diffused by annealing) is approximately 10 nm.

Figure 3A:
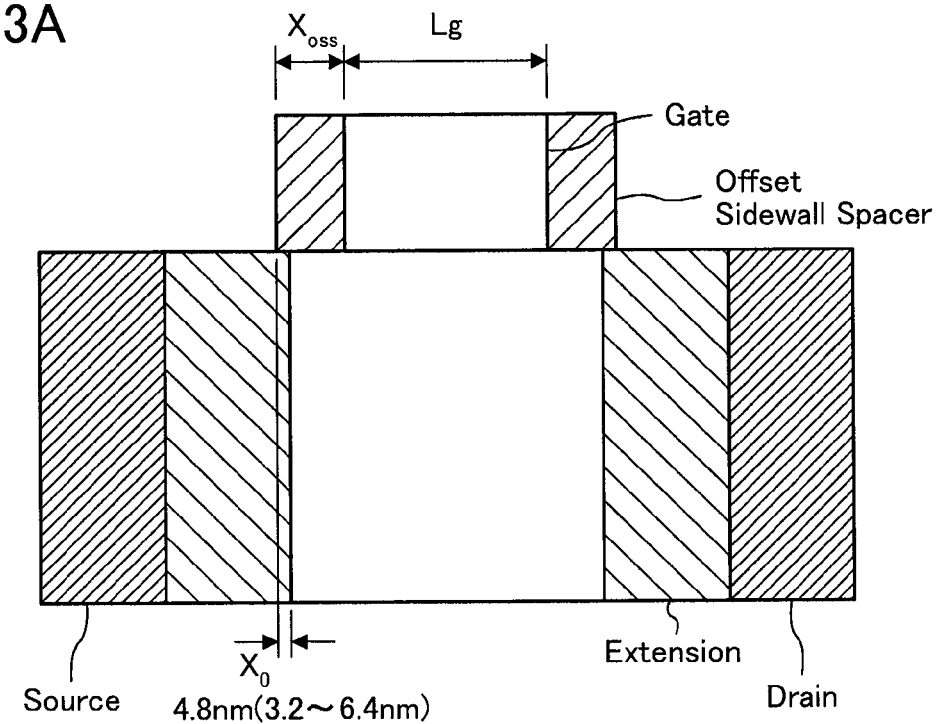
FIG. 3A is a diagram schematically illustrating the structure of a fin-FET with the profile illustrated in FIG. 2 immediately after plasma doping.
Figure 3B:
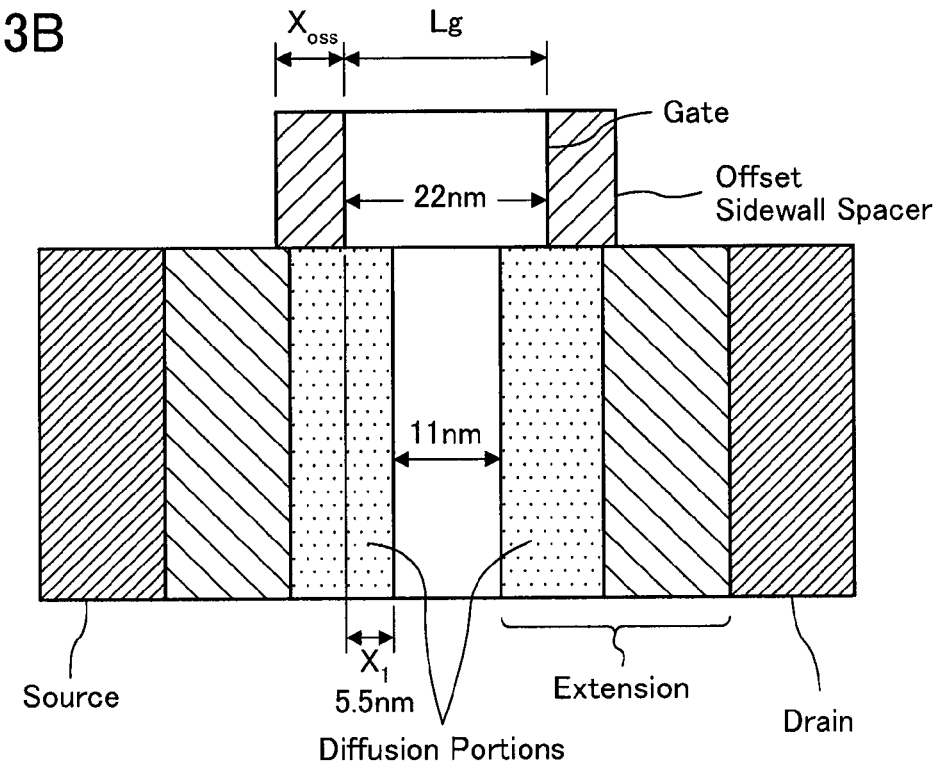
FIG. 3B is a diagram schematically illustrating the structure of a fin-FET with the profile illustrated in FIG. 2 after annealing.

FIG. 3A schematically illustrates the structure of a fin-FET with the profile illustrated in FIG. 2 immediately after plasma doping, and FIG. 3B schematically illustrates the structure of a fin-FET with the profile illustrated in FIG. 2 after annealing. Here, the gate length (Lg) is 22 nm, and the fin-FET is directed to a double gate FET having a fin top surface covered with a hard mask. The fin top surface of such a double gate FET is covered with a hard mask during plasma doping, and thus, impurities are not implanted into the fin top surface, thereby preventing the fin top surface from functioning as an extension region or a source/drain region. In other words, impurities are implanted only into the fin side surfaces, and thus, only the fin side surfaces function as extension regions or source/drain regions.

When the gate length Lg is 22 nm, the effective channel length is preferably at least half of the gate length Lg, i.e., approximately 11 nm. In this case, the distance from the end of the gate near the source to the end of the channel near the source ($X_1$ in FIG. 3B, i.e., the amount of overlapping of the gate and an extension region) is approximately half of 11 nm, i.e., approximately 5.5 nm. Here, the impurity diffusion length in annealing, i.e., 10 nm, which is determined based on the profiles illustrated in FIG. 2, is greater than 5.5 nm. Therefore, when arsenic is diffused from the end of the gate near the source in annealing, the effective channel length is so short that a problem occurs. To address a situation where the impurity diffusion length in annealing is long as described above, the structures illustrated in FIGS. 3A and 3B each include an offset sidewall spacer described in the International Technology Roadmap for Semiconductors (ITRS).

The character $X_0$ in FIG. 3A (the structure of the double gate FET immediately after plasma doping) denotes a distance to which ions implanted with energy in plasma doping spread (diffuse) to the channel (to immediately below the offset sidewall spacer). However, the ion introduction energy in plasma doping is lower than the implantation energy in ion implantation, and thus, the distance $X_0$ can be set less than or equal to 10 nm. Furthermore, the distance $X_0$ can be set less than or equal to 7 nm by lowering the ion introduction energy in plasma doping. For example, when, under the plasma doping conditions providing the profiles illustrated in FIG. 2, the bias voltage (Vpp) was set at 250 V, the implantation depth in the direction of ion introduction was 6.4 nm. In this case, the length to which ions spread in a lateral direction (in a direction vertical to the direction of ion introduction) will be greater than or equal to half of the implantation depth in the direction of ion introduction and less than or equal to the implantation depth, and thus, the distance $X_0$ will be greater than or equal to 3.2 nm and less than or equal to 6.4 nm (and have a central value of 4.8 nm).

When the width of the offset sidewall spacer is denoted by the character $X_{OSS}$, the width $X_{OSS}$ is set so that the expression $(X_1-X_0+X_{OSS})$ is equal to the impurity diffusion length in annealing, i.e., 10 nm, which is obtained based on the profiles illustrated in FIG. 2. Specifically, the width $X_{OSS}$ needs to be set greater than or equal to 7.7 nm and less than or equal to 10.9 nm because the distance $X_1$ is approximately 5.5 nm, the distance $X_0$ is greater than or equal to 3.2 nm and less than or equal to 6.4 nm, and the expression $(X_1-X_0+X_{OSS})$ is equal to 10 nm.

As described above, such a double gate FET having a distance $X_1$ of 5.5 nm as illustrated in FIG. 3B can be obtained in the following manner: (i) the length $(X_0)$ of As diffusion to the channel in plasma doping is set greater than or equal to 3.2 nm and less than or equal to 6.4 nm by setting the bias voltage Vpp in plasma doping at 250 V; (ii) the impurity diffusion length $(X_1-X_0+X_{OSS})$ in annealing is adjusted to 10 nm by setting the annealing (spike RTA) temperature at 1025° C.; and (iii) the width $(X_{OSS})$ of the offset sidewall spacer is set greater than or equal to 7.7 nm and less than or equal to 10.9 nm.

Incidentally, the resistance of a fin side surface is estimated only based on the spreading resistance. By contrast, the resistance of an extension region required for a fin semiconductor device in the ITRS is expressed in terms of the sheet resistance. Therefore, the present inventors attempted to convert the maximum drain extension sheet resistance for multi-gate MPU/ASIC (NMOS) described in the ITRS 2008 Update to the spreading resistance. Referring to Table FEP4a in the ITRS 2008 Update, a required sheet resistance in or before 2014 is not described, and the sheet resistance desired in 2015 is 441 SI/sq. Subsequently, referring to Table FEP4b, the sheet resistances required in 2016; 2017, 2018, 2019, 2020, 2021, and 2022 are 475 Ω/sq., 526 Ω/sq., 590 Ω/sq., 642 Ω/sq., 691 Ω/sq., 753Ω/sq., 868 Ω/sq., respectively. This shows that the sheet resistance of an extension region desired in the ITRS between now and 2022 is in the range of less than or equal to 868 Ω/sq. Here, referring to FIG. 1, a sheet resistance of 868 Ω/sq. corresponds to a spreading resistance of $3.5\times10^4 \Omega$.

Therefore, when the diffusion depth of the fin top surface is equal to the diffusion depth of a fin side surface, or when the diffusion depth of the fin side surface is greater than that of the fin top surface, the sheet resistance desired in the ITRS is satisfied by setting the spreading resistance of the fin side surface at $3.5\times10^4\Omega$ or less. Specifically, the spreading resistance of the fin side surface is preferably set less than or equal to $3.5\times10^4\Omega$.

Next, a case in which high temperature and short time annealing, such as laser annealing or flash lamp annealing, is used as the above-described annealing will be described. When such high temperature and short time annealing is performed, a sheet resistance approximately equal to the sheet resistance obtained by usual annealing can be obtained with a further reduction in the impurity diffusion length. Therefore, a combination of the above-described plasma doping and high temperature and short time annealing enables the formation of a fin-FET in which no offset sidewall spacer is used.

Figure 4A:
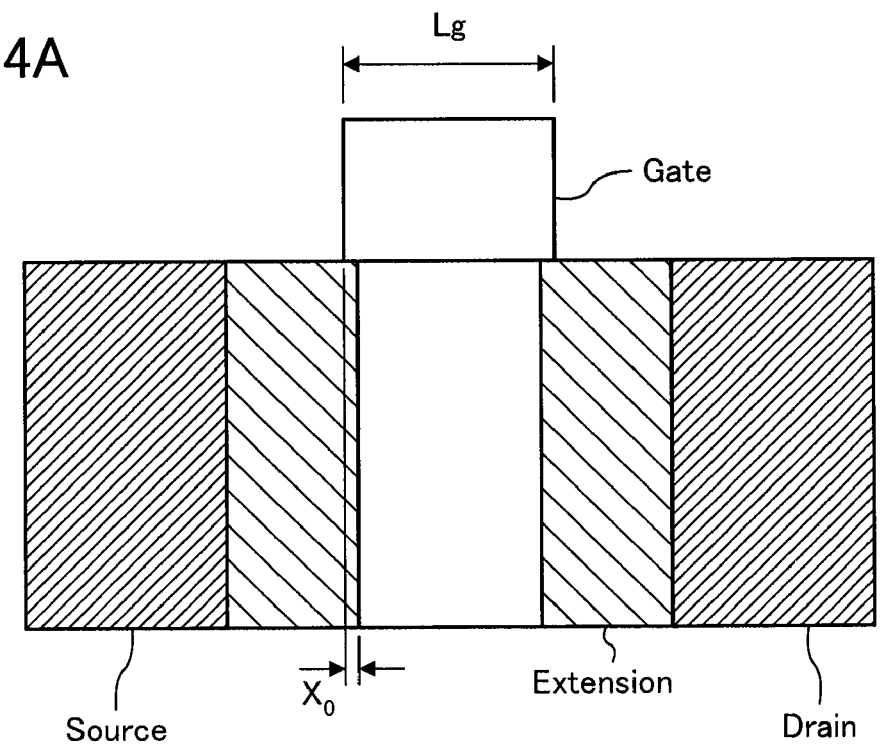
FIG. 4A is a diagram schematically illustrating the structure of a fin-FET immediately after plasma doping when plasma doping, and high temperature and short time annealing are used in combination.
Figure 4B:
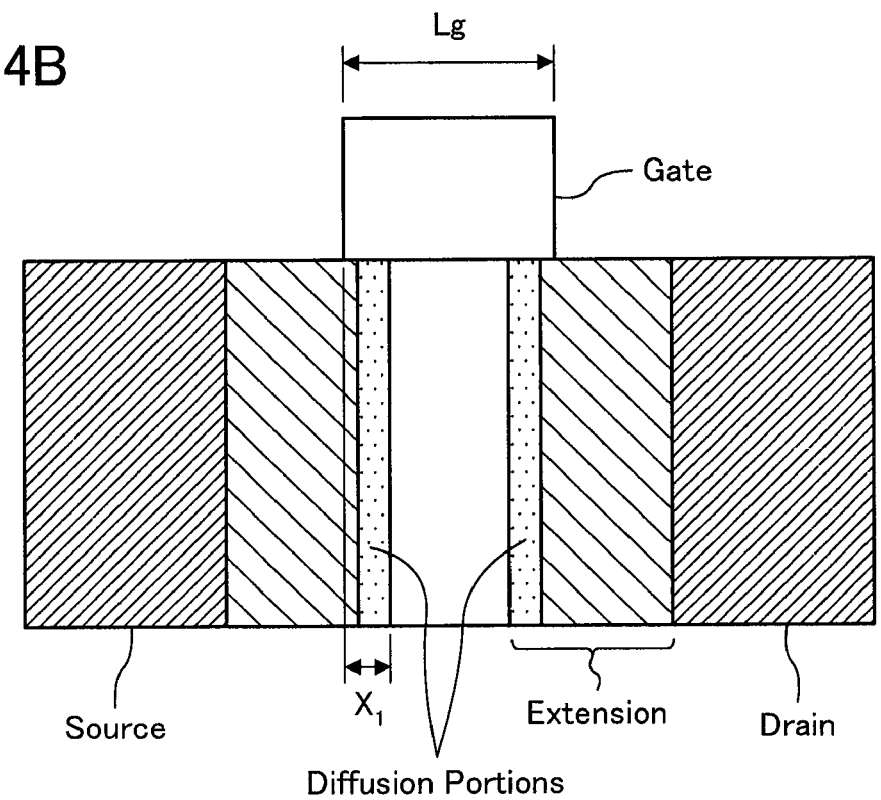
FIG. 4B is a diagram schematically illustrating the structure of a fin-FET after high temperature and short time annealing when plasma doping, and high temperature and short time annealing are used in combination.

FIG. 4A schematically illustrates the structure of a fin-FET immediately after plasma doping when plasma doping and high temperature and short time annealing are used in combination, and FIG. 4B schematically illustrates the structure of a fin-FET after high temperature and short time annealing when plasma doping and high temperature and short time annealing are used in combination.

Also in the cases illustrated in FIGS. 4A and 4B, when the length $(X_0)$ of As diffusion to the channel in plasma doping is set greater than or equal to 3.2 nm and less than or equal to 6.4 nm by setting the bias voltage Vpp in plasma doping at 250 V, and the impurity diffusion length $(X_1-X_0)$ in annealing is reduced to a small value close to approximately zero, such a double gate FET as illustrated in FIG. 4B can be obtained in which the distance $X_1$ is greater than or equal to 3.2 nm and less than or equal to 6.4 nm. A desired distance $X_1$, i.e., 5.5 nm, falls within the above range of distances $X_1$. For example, when the distance $X_1$ is an average value in the range of 3.2-6.4 nm, i.e., 4.8 nm, a reduction of the diffusion length $(X_1-X_0)$ in annealing to 0.7 nm can provide a double gate FET in which the distance $X_1$ is 5.5 nm.

Next, the structure illustrated in FIG. 4B and the structure illustrated in FIG. 3B will be compared with each other. The As concentration in an impurity region formed by diffusing impurities using annealing is lower than that in the impurity region immediately after plasma doping. Furthermore, with an increase in the length of impurity diffusion using annealing, the resistivity of a leading end portion of a diffusion region increases. Therefore, in order to reduce the resistance between the source and drain of a FET, the shorter the length of impurity diffusion using annealing is, the more preferable. Here, in the structure illustrated in FIG. 4B, the impurity diffusion length $(X_1-X_0)$ in annealing is 0.7 nm, and in the structure illustrated in FIG. 3B, the impurity diffusion length $(X_1-X_0+X_{OSS})$ in annealing is 10 nm. Therefore, high temperature and short time annealing is preferably performed by adjusting the temperature and the annealing time in high temperature and short time annealing to provide the same resistivity as the resistivity obtained by the spike RTA at 1025° C. because the distance between the source and drain decreases as in the structure illustrated in FIG. 4B, and thus, the resistance between the source and drain is significantly reduced.

In the structure illustrated in FIG. 4B, the resistivity will be greater than the resistivity obtained by the spike RTA at 1025° C. due to a reduction in the impurity diffusion length. However, there is no problem as long as an increase in the resistivity is small enough to be compensated for by a resistance reduction arising from a reduction in the above distance between the source and drain. For example, assume that a region with As concentrations of greater than or equal to $1\times10^{20}$ cm$^{-3}$ is to be electrically activated by annealing. In this case, when the impurity diffusion length in annealing is 0.7 nm, adding 0.7 nm to the profile illustrated in FIG. 2 immediately after plasma doping provides a region which extends to a depth of approximately 5 nm and has As concentrations of greater than or equal to $1\times10^{20}$ cm$^{-3}$ (i.e., the region to be electrically activated). By contrast, when the impurity diffusion length in annealing is 10 nm, a region extending to a depth of approximately 12.5 nm corresponds to the region with As concentrations of greater than or equal to $1\times10^{20}$ cm$^{-3}$ (i.e., the region to be electrically activated) as shown by the profile illustrated in FIG. 2 after annealing. Therefore, when attention is directed toward the length of a portion of each of extension regions formed under the gate by plasma doping and annealing, the length in high temperature and short time annealing is reduced to approximately 5 nm/12.5 nm=0.4 times that in usual annealing. Therefore, when high temperature and short time annealing is used, the resistivity may be increased to 2.5 times that when usual annealing is used. Specifically, when high temperature and short time annealing is used, the spreading resistance of a fin side surface is preferably set less than or equal to $8.8\times10^4\Omega$.

The following example embodiment will be described based on the target spreading resistance of the fin side surface set as described above.

Example Embodiment

A method for fabricating a semiconductor device according to an example embodiment will be described hereinafter, together with a specific process for achieving the target spreading resistance of the fin side surface set as described above, with reference to the drawings.

FIGS. 5A-5D are cross-sectional views illustrating process steps in a method for fabricating a semiconductor device according to this example embodiment.

Figure 5A:
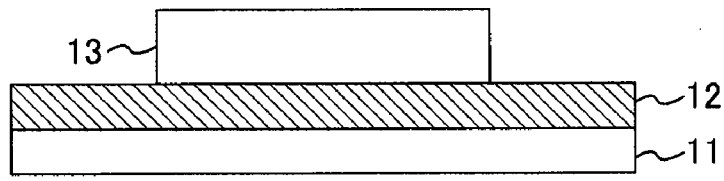
FIGS. 5A-5D are cross-sectional views illustrating process steps in a method for fabricating a semiconductor device according to an example embodiment.
Figure 6A:
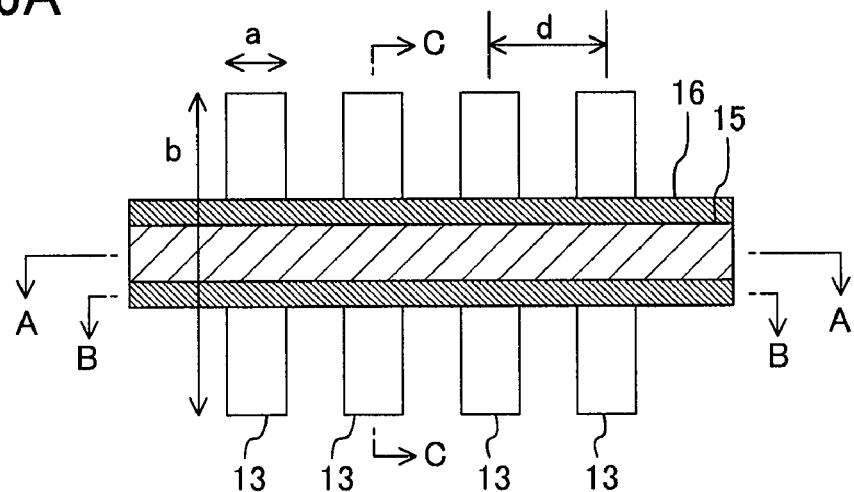

First, as illustrated in FIG. 5A, a semiconductor on insulator (SOI) substrate is prepared which includes a 150-nm-thick insulating layer 12 made of, e.g., silicon oxide and formed on a 800-μ-thick support substrate 11 made of, e.g., silicon, and a 50-nm-thick semiconductor layer made of, e.g., silicon and formed on the insulating layer 12. Thereafter, the semiconductor layer is patterned, thereby forming p-type fin-type semiconductor regions 13 serving as active regions. The width (a) of each of the fin-type semiconductor regions 13 along the gate width is, e.g., greater than or equal to 5 nm and less than or equal to 15 nm, the width (b) thereof along the gate length is, e.g., approximately 200 nm, the height (thickness) (c) thereof is, e.g., approximately 50 nm, and the pitch (d) between each adjacent pair of the fin-type semiconductor regions 13 is, e.g., approximately 1-2 times the width (a) (see FIG. 6A).

Figure 5B:
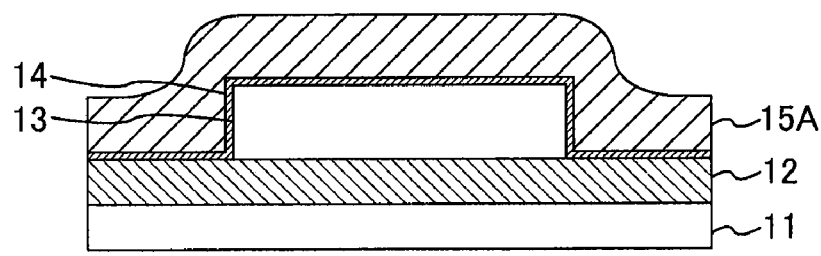

Next, as illustrated in FIG. 5B, a 3-nm-thick gate insulating film 14 made of, e.g., a silicon oxynitride film is formed to cover the outer surfaces of the fin-type semiconductor regions 13, and then, e.g., a 60-nm-thick polysilicon film 15A is formed to cover the entire surface region of the support substrate 12.

Figure 5C:
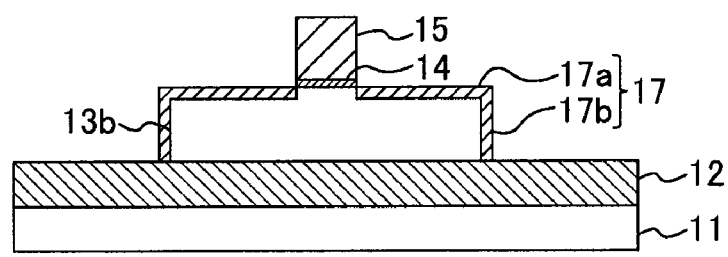

Next, as illustrated in FIG. 5C, the polysilicon film 15A and the gate insulating film 14 are sequentially etched, and thus, a gate electrode 15 having a width of, e.g., 20 nm along the gate length is formed on the fin-type semiconductor regions 13 with the gate insulating film 14 interposed therebetween. Thereafter, n-type impurities are introduced into upper and side portions of the fin-type semiconductor regions 13 by plasma doping using the gate electrode 15 as a mask, thereby forming first n-type impurity regions 17a and second n-type impurity regions 17b serving as extension regions 17 in the upper and side portions, respectively, of the fin-type semiconductor regions 13. Here, the plasma doping conditions are such that, for example, the material gas is arsine (AsH$_3$) diluted with helium (He), the AsH$_3$ concentration in the material gas is 0.05% by mass, the total flow rate of the material gas is 440 cm$^3$/min (standard state), the internal chamber pressure is 0.5 Pa, the source power (the plasma-generating high-frequency power) is 500 W, the bias voltage (Vpp) is 250 V, the substrate temperature is 22° C., and the plasma doping time is 60 seconds.

One of the features of this example embodiment is that when the source power in the plasma doping for forming the extension region 17 is denoted by the character Y [W], the supply of a gas containing n-type impurities (i.e., AsH$_3$) per unit time and per unit volume is set greater than or equal to $5.1\times10^{-8}/((1.7^{2.51}/2^{4.51})\times(Y/500))$ [mol/(min·L·sec)], the supply of a diluent gas (i.e., He) per unit time and per unit volume is set greater than or equal to $1.7\times10^{-4}/((20^{2.51}/2^{4.51})\times(Y/500))$ [mol/(min·L·sec)], and the internal chamber pressure is set less than or equal to 0.6 Pa. This allows the spreading resistance of the second n-type impurity region 17b corresponding to a portion of the extension region 17 located in a side portion of each of the fin-type semiconductor regions 13 to be set less than $9.0\times10^4\Omega$, more specifically, less than or equal to $8.8\times10^4\Omega$.

Figure 5D:
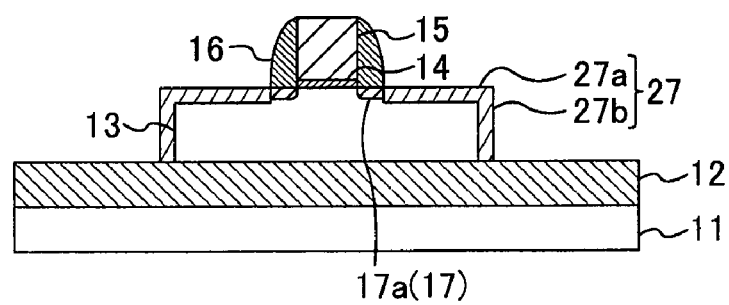

Next, e.g., a 60-nm-thick insulating film is formed to cover the entire surface region of the support substrate 12, and then, the insulating film is etched back using anisotropic dry etching, thereby forming insulative sidewall spacers 16 on the side surfaces of the gate electrode 15 as illustrated in FIG. 5D. Thereafter, n-type impurities are introduced into the upper and side portions of the fin-type semiconductor regions 13 by plasma doping using the gate electrode 15 and the insulative sidewall spacers 16 as masks, thereby forming third n-type impurity regions 27a and fourth n-type impurity regions 27b serving as source/drain regions 27 in the upper and side portions, respectively, of the fin-type semiconductor regions 13. Here, the plasma doping conditions are such that, for example, the material gas is arsine (AsH$_3$) diluted with helium (He), the AsH$_3$ concentration in the material gas is 0.05% by mass, the total flow rate of the material gas is 440 cm$^3$/min (standard state), the internal chamber pressure is 0.5 Pa, the source power (the plasma-generating high-frequency power) is 500 W, the bias voltage (Vpp) is 250 V, the substrate temperature is 22° C., and the plasma doping time is 60 seconds.

One of the features of this example embodiment is that when the source power in the plasma doping for forming the source/drain regions 27 is denoted by the character Y [W], the supply of a gas containing n-type impurities (i.e., AsH$_3$) per unit time and per unit volume is set greater than or equal to $5.1\times10^{-8}/((1.7^{2.51}/2^{4.51})\times(Y/500))$ [mol/(min·L·sec)], the supply of a diluent gas (i.e., He) per unit time and per unit volume is set greater than or equal to $1.7\times10^{-4}/((20^{2.51}/2^{4.51})\times(Y/500))$ [mol/(min·L·sec)], and the internal chamber pressure is set less than or equal to 0.6 Pa. This allows the spreading resistance of the fourth n-type impurity region 27b corresponding to a portion of the source/drain region 27 located in a side portion of each of the fin-type semiconductor regions 13 to be set less than $9.0\times10^4\Omega$, more specifically, less than or equal to $8.8\times10^4\Omega$.

Figure 6B:
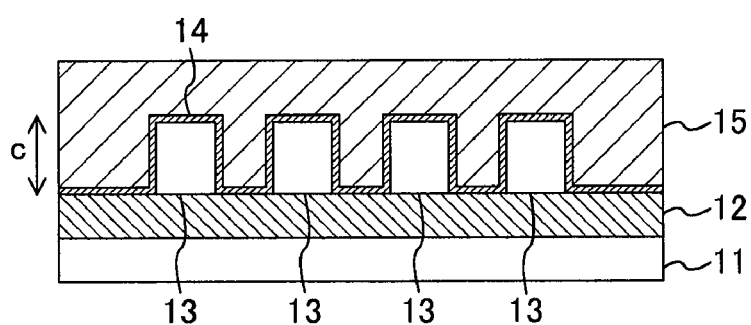
Figure 6C:
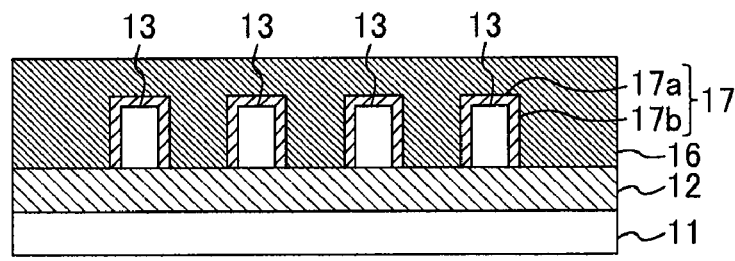

FIGS. 6A-6C are diagrams illustrating the structure of a fin-FET of this example embodiment formed as described above, in which FIG. 6A is a plan view thereof, FIG. 6B is a cross-sectional view taken along the line A-A in FIG. 6A, and FIG. 6C is a cross-sectional view taken along the line B-B in FIG. 6A. FIG. 5D corresponds to a cross-sectional view taken along the line C-C in FIG. 6A.

As illustrated in FIGS. 6A-6C and 5D, the fin-FET of this example embodiment includes a support substrate 11 made of, e.g., silicon, an insulating layer 12 formed on the support substrate 11 and made of, e.g., silicon oxide, a plurality of fin-type semiconductor regions 13 formed on the insulating layer 12, a gate electrode 15 formed on the fin-type semiconductor regions 13 with a gate insulating film 14 interposed therebetween, insulative sidewall spacers 16 formed on the side surfaces of the gate electrode 15, extension regions 17 formed in regions of each of the fin-type semiconductor regions 13 lateral to the gate electrode 15, and source/drain regions 27 formed in regions of the fin-type semiconductor region 13 lateral to a combination of the gate electrode 15 and the insulative sidewall spacers 16. The fin-type semiconductor regions 13 are disposed on the insulating layer 12 so as to be arranged at regular intervals along the gate width. The gate electrode 15 is formed astride the fin-type semiconductor regions 13 along the gate width. The extension regions 17 each include a first n-type impurity region 17a formed in an upper portion of the corresponding fin-type semiconductor region 13, and a second n-type impurity region 17b formed in a side portion of the fin-type semiconductor region 13. The source/drain regions 27 each include a third n-type impurity region 27a formed in an upper portion of the corresponding fin-type semiconductor region 13, and a fourth n-type impurity region 27b formed in a side portion of the fin-type semiconductor region 13. A pocket region is neither described nor illustrated.

As described above, according to this example embodiment, when the source power in the plasma doping for forming the extension regions 17 is denoted by the character Y [W], the supply of a gas containing n-type impurities (i.e., $AsH_3$) per unit time and per unit volume is set greater than or equal to $5.1\times10^{-8}/((1.7^{2.51}/2^{4.51})\times(Y/500))$ [mol/(mm·L·sec)], the supply of a diluent gas (i.e., He) per unit time and per unit volume is set greater than or equal to $1.7\times10^{-4}/((20^{2.51}/2^{4.51})\times(Y/500))$ [mol/(min·L·sec)], and the internal chamber pressure is set less than or equal to 0.6 Pa. This can reduce the resistance of the second n-type impurity region 17b corresponding to a portion of the extension region 17 located in a side portion of each fin-type semiconductor region 13 (i.e., allows the spreading resistance to be less than $9.0\times10^4\Omega$), thereby obtaining an n-type fin semiconductor device having desired characteristics. Furthermore, the sheet resistance of the second n-type impurity region 17b formed in a side portion of the fin-type semiconductor region 13 can be set substantially equal to or less than the value required for an extension region in the ITRS. Therefore, even when the ratio of the width of the second n-type impurity region 17b to the width of the extension region 17 along the gate width is increased, desired transistor characteristics can be achieved.

According to this example embodiment, when the source power in the plasma doping for forming the source/drain regions 27 is denoted by the character Y [W], the supply of a gas containing n-type impurities (i.e., $AsH_3$) per unit time and per unit volume is set greater than or equal to $5.1\times10^{-8}/((1.7^{2.51}/2^{4.51})\times(Y/500))$ [mol/(min·L·sec)], and the supply of a diluent gas (i.e., He) per unit time and per unit volume is set greater than or equal to $1.7\times10^{-4}/((20^{2.51}/2^{4.51})\times(Y/500))$ [mol/(min·L·sec)]. This can reduce the resistance of the fourth n-type impurity region 27b corresponding to a portion of the source/drain region 27 located in a side portion of each fin-type semiconductor region 13 (i.e., allows the spreading resistance to be less than $9.0\times10^4\Omega$). Therefore, since the sheet resistance of the fourth n-type impurity region 27b formed in a side portion of the fin-type semiconductor region 13 can be set substantially equal to that of each of the extension regions 17, this facilitates moving carriers from the source/drain regions 27 to the extension regions 17, thereby achieving desired transistor characteristics. Furthermore, the sheet resistance of the fourth n-type impurity region 27b formed in a side portion of the fin-type semiconductor region 13 can be set substantially equal to or less than the value required for a source/drain region in the ITRS. Therefore, even when the ratio of the width of the fourth n-type impurity region 27b to the width of the corresponding source/drain region 27 along the gate width is increased, desired transistor characteristics can be achieved.

According to this example embodiment, when plasma doping is used to form the source/drain region 27 in each fin-type semiconductor region 13, this can avoid a problem in which such amorphization of the fin-type semiconductor region as in the use of ion implantation makes it difficult to recover crystals even after annealing.

In this example embodiment, when the source power in the plasma doping for forming at least either the extension regions 17 or the source/drain regions 27 is denoted by the character Y [W], the supply of a gas containing n-type impurities (i.e., $AsH_3$) per unit time and per unit volume may be set greater than or equal to $7\times10^{-8}/((1.7^{2.51}/2^{4.51})\times(Y/500))$ [mol/(min·L·sec)], and the supply of a diluent gas (i.e., He) per unit time and per unit volume may be set greater than or equal to $1.7\times10^{-3}/((20^{2.51}/2^{4.51})\times(Y/500))$ [mol/(min·L·sec)]. This can further reduce the resistances of the second n-type impurity region 17b and the fourth n-type impurity region 27b corresponding to side portions of each fin-type semiconductor region 13 (i.e., allows the spreading resistance to be less than or equal to $6.3\times10^4\Omega$), thereby achieving better transistor characteristics.

In this example embodiment, when the source power in the plasma doping for forming at least either the extension regions 17 or the source/drain regions 27 is denoted by the character Y [W], the supply of a gas containing n-type impurities (i.e., $AsH_3$) per unit time and per unit volume may be set greater than or equal to $8.7\times10^{-8}/((1.7^{2.51}/2^{4.51})\times(Y/500))$ [mol/(min·L·sec)], and the supply of a diluent gas (i.e., He) per unit time and per unit volume may be set greater than or equal to $3.4\times10^{-3}/((20^{2.51}/2^{4.51})\times(Y/500))$ [mol/(min·L·sec)]. This can further reduce the resistances of the second n-type impurity region 17b and the fourth n-type impurity region 27b corresponding to side portions of each fin-type semiconductor region 13 (i.e., allows the spreading resistance to be less than or equal to $3.6\times10^4\Omega$), thereby achieving better transistor characteristics.

In this example embodiment, a triple gate fin semiconductor device is fabricated which includes extension regions 17 and source/drain regions 27 in upper and side portions of each fin-type semiconductor region 13. However, alternatively, a double gate fin semiconductor device may be fabricated which includes extension regions 17 and source/drain regions 27 in side portions of each fin-type semiconductor region 13.

In this example embodiment, $AsH_3$ diluted with He is used as the material gas for plasma doping for forming the extension regions 17 and the source/drain regions 27. However, the material gas is not limited to any particular gas as long as it is a gas containing n-type impurities to be implanted into the fin-type semiconductor regions 13. For example, instead of $AsH_3$, other molecules containing arsenic atoms, or other molecules comprised of arsenic atoms and hydrogen atoms may be used. Alternatively, $PH_3$, etc., containing phosphorus (P) atoms may be used. Helium is used as the diluent gas for diluting the gas containing the n-type impurities. However, instead of helium, any other rare gas, such as neon (Ne), or hydrogen ($H_2$) may be used. Alternatively, the gas containing the n-type impurities does not need to be diluted with a diluent gas.

While, in this embodiment, the plasma generation method is not particularly limited, e.g., an ICP method or a pulse method may be used as the plasma generation method.

Restrictions on the supplies of the gas containing the n-type impurities and the diluent gas in plasma doping for forming the extension regions 17 and the source/drain regions 27 in this example embodiment, the technical significance of the restrictions, and the advantages provided by the restrictions will be described hereinafter in detail.

[Reduction in Resistance of Fin Side Surface Resulting from Setting of Total Gas Flow Rate]

First, a reduction in the resistance (spreading resistance) of a fin side surface resulting from the setting of the total gas flow rate will be described with reference to the drawings.

Figure 7:
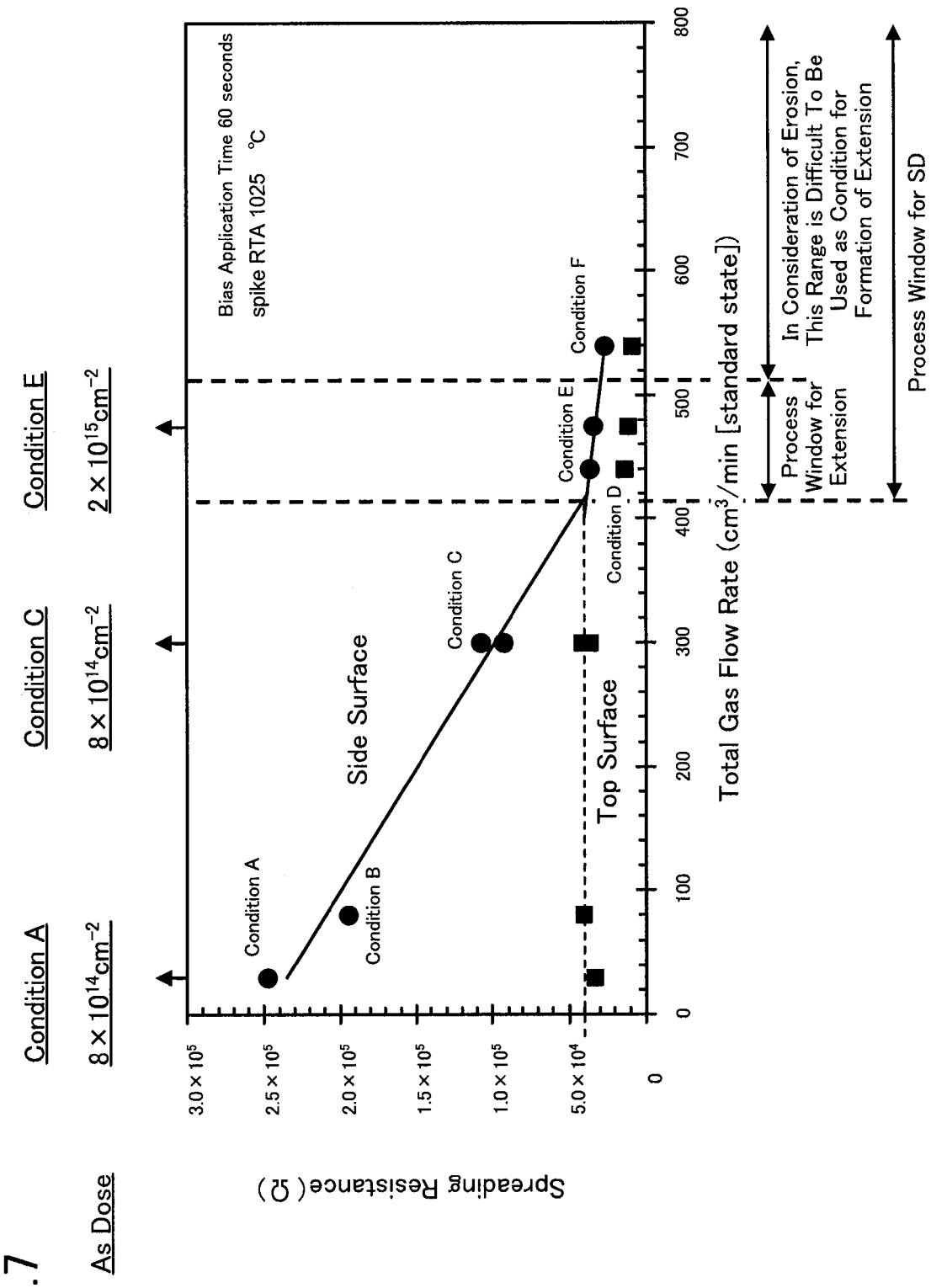
FIG. 7 is a graph illustrating the relationship between the total gas flow rate and the spreading resistance of a fin side surface.

FIG. 7 illustrates the influence of variations in the total gas flow rate on the spreading resistances of the fin top surface and a fin side surface. Here, the height and width of each of fin-type semiconductor regions for use in samples is 120 nm and 160 nm, respectively, and the distance between each adjacent pair of the fin-type semiconductor regions is 210 nm. In other words, the distance between the widthwise center of each fin-type semiconductor region and the widthwise center of an adjacent fin-type semiconductor region is 370 nm. Furthermore, a corner portion (hereinafter referred to as the fin corner portion) of the fin-type semiconductor region before plasma doping has a radius of curvature of 8.7 nm. The reason why the fin corner portion forms not an exact right angle but a shape with curvature even before plasma doping is that the fin corner portion is, albeit slightly, chipped in dry etching and cleaning process steps before the plasma doping process step. The plasma doping condition for each of the samples is such that the material gas is $AsH_3$ diluted with He, the $AsH_3$ concentration in the material gas is 0.05-0.8% by mass, the internal chamber pressure is 0.35-0.55 Pa, the source power (the plasma-generating high-frequency power) is 500 W, the bias voltage Vpp is 250 V, the substrate temperature is 22° C., the plasma doping time is 60 seconds, the ICP method is used as the plasma generation method, and the chamber volume is 93 liters (L).

In order to reduce the amount of chipping of the fin corner portion by extremely reducing the amount of ions applied to the fin top surface, the internal chamber pressure is set low for the ICP method, such as less than or equal to 0.55 Pa. For comparison, FIG. 7 also illustrates a comparative example in which the pressure was set higher than 0.6 Pa (specifically, at 0.65 Pa).

A more specific plasma doping condition for each of the samples will be described below. However, common plasma doping conditions for all the samples are such that the material gas is $AsH_3$ diluted with He, the source power (the plasma-generating high-frequency power) is 500 W, the bias voltage Vpp is 250 V, the substrate temperature is 22° C., the plasma doping time is 60 seconds, and the chamber volume is 93 L.

The condition A was set such that the $AsH_3$ concentration in the material gas was 0.8% by mass, the internal chamber pressure was 0.35 Pa, and the total flow rate of a combination of He and $AsH_3$ was 30 cm$^3$/min (standard state).

The condition B was set such that the $AsH_3$ concentration in the material gas was 0.8% by mass, the internal chamber pressure was 0.35 Pa, and the total flow rate of a combination of He and $AsH_3$ was 80 cm$^3$/min (standard state).

The condition C was set such that the $AsH_3$ concentration in the material gas was 0.05% by mass, the internal chamber pressure was 0.4 Pa, and the total flow rate of a combination of He and $AsH_3$ was 300 cm$^3$/min (standard state).

The condition D was set such that the $AsH_3$ concentration in the material gas was 0.05% by mass, the internal chamber pressure was 0.5 Pa, and the total flow rate of a combination of He and $AsH_3$ was 440 cm$^3$/min (standard state).

The condition E was set such that the $AsH_3$ concentration in the material gas was 0.05% by mass, the internal chamber pressure was 0.55 Pa, and the total flow rate of a combination of He and $AsH_3$ was 475 cm$^3$/min (standard state).

The condition F was set such that the $AsH_3$ concentration in the material gas was 0.05% by mass, the internal chamber pressure was 0.65 Pa, and the total flow rate of a combination of He and $AsH_3$ was 540 cm$^3$/min (standard state).

Each sample was subjected to plasma doping under the above corresponding condition, and then subjected to annealing (specifically, spike RTA at 1025° C.), and thereafter, the spreading resistance and erosion on the fin corner portion were measured by SSRM and scanning electron microscopy (SEM) observation, respectively. Furthermore, the flat principal surfaces of silicon substrates were subjected to plasma doping under the above corresponding conditions separately, the silicon substrates were then subjected to annealing (specifically, spike RTA at 1025° C.), and thereafter, the sheet resistances were measured using a four-point probe technique.

Consequently, under each of the above conditions, the sheet resistance, the spreading resistance of the fin top surface, the spreading resistance of a fin side surface, and the amount of increase in the radius of curvature of the fin corner portion were obtained as described below.

Under the condition A, the sheet resistance was 777 Ω/sq., the spreading resistance of the fin top surface was $3.3 \times 10^4 \Omega$, the spreading resistance of the fin side surface was $2.5 \times 10^5 \Omega$, and the amount of increase in the radius of curvature of the fin corner portion was 0.6 nm.

Under the condition B, the sheet resistance was not measured, the spreading resistance of the fin top surface was $4.0 \times 10^4 \Omega$, the spreading resistance of the fin side surface was $1.9 \times 10^5 \Omega$, and the amount of increase in the radius of curvature of the fin corner portion was 0.7 nm.

Under the condition C, the sheet resistance was 1011 Ω/sq., the spreading resistance of the fin top surface was $3.6 \times 10^4 \Omega$, the spreading resistance of the fin side surface was $9.3 \times 10^4 \Omega$, and the amount of increase in the radius of curvature of the fin corner portion was 0.9 nm.

Under the condition D, the sheet resistance was 550 Ω/sq., the spreading resistance of the fin top surface was $1.3 \times 10^4 \Omega$, the spreading resistance of the fin side surface was $3.6 \times 10^4 \Omega$, and the amount of increase in the radius of curvature of the fin corner portion was 1.2 nm.

Under the condition E, the sheet resistance was 500 Ω/sq., the spreading resistance of the fin top surface was $1.1 \times 10^4 \Omega$, the spreading resistance of the fin side surface was $3.3 \times 10^4 \Omega$, and the amount of increase in the radius of curvature of the fin corner portion was 2.0 nm.

Under the condition F, the sheet resistance was 478 Ω/sq., the spreading resistance of the fin top surface was $8.2 \times 10^3 \Omega$, the spreading resistance of the fin side surface was $2.6 \times 10^4 \Omega$, and the amount of increase in the radius of curvature of the fin corner portion was 5.7 nm.

FIG. 7 which is a graph providing a summary of the above results shows that the boundary value (threshold) of the total gas flow rate is approximately 420 cm$^3$/min (standard state), arsenic is less likely to enter the fin side surfaces in the range of total gas flow rates of less than the threshold, and arsenic tends to enter the fin side surfaces in the range of total gas flow rates of greater than or equal to the threshold. Specifically, the trend in the rate of decrease in the spreading resistance with an increase in the total gas flow rate in the range of total gas flow rates of less than the threshold is different from that in the range of total gas flow rates of greater than or equal to the threshold. In FIG. 7, the symbol ● denotes the spreading resistance of a fin side surface, and the symbol ■ denotes the spreading resistance of the fin top surface.

Specifically, while, in the range of total gas flow rates of less than the threshold, an increase in the total gas flow rate enables the introduction of a significant amount of arsenic into a fin side surface, the absolute value itself of the amount of the introduced arsenic is insufficient, and thus, the spreading resistance of a fin side surface is high. By contrast, in the range of total gas flow rates of greater than or equal to the threshold, even with an increase in the total gas flow rate, the rate of increase in the amount of the introduced arsenic is lower than that in the range of total gas flow rates of less than the threshold. However, the absolute value of the amount of the introduced arsenic reaches the practical level, and thus, the spreading resistance of a fin side surface is low. Specifically, the spreading resistance of the fin side surface can be reduced to a low level of less than or equal to $4 \times 10^4 \Omega$ by setting the total gas flow rate at approximately 420 cm$^3$/min (standard state) or more. Furthermore, the proportional distribution of the result under the condition D and the result under the condition E shows that the spreading resistance of the fin side surface can be reduced to $3.5 \times 10^4 \Omega$ or less, i.e., the most preferable level satisfying the sheet resistance desired in the ITRS, by setting the total gas flow rate at 452 cm$^3$/min (standard state) or more.

[Threshold Total Gas Flow Rate]

Figure 8:
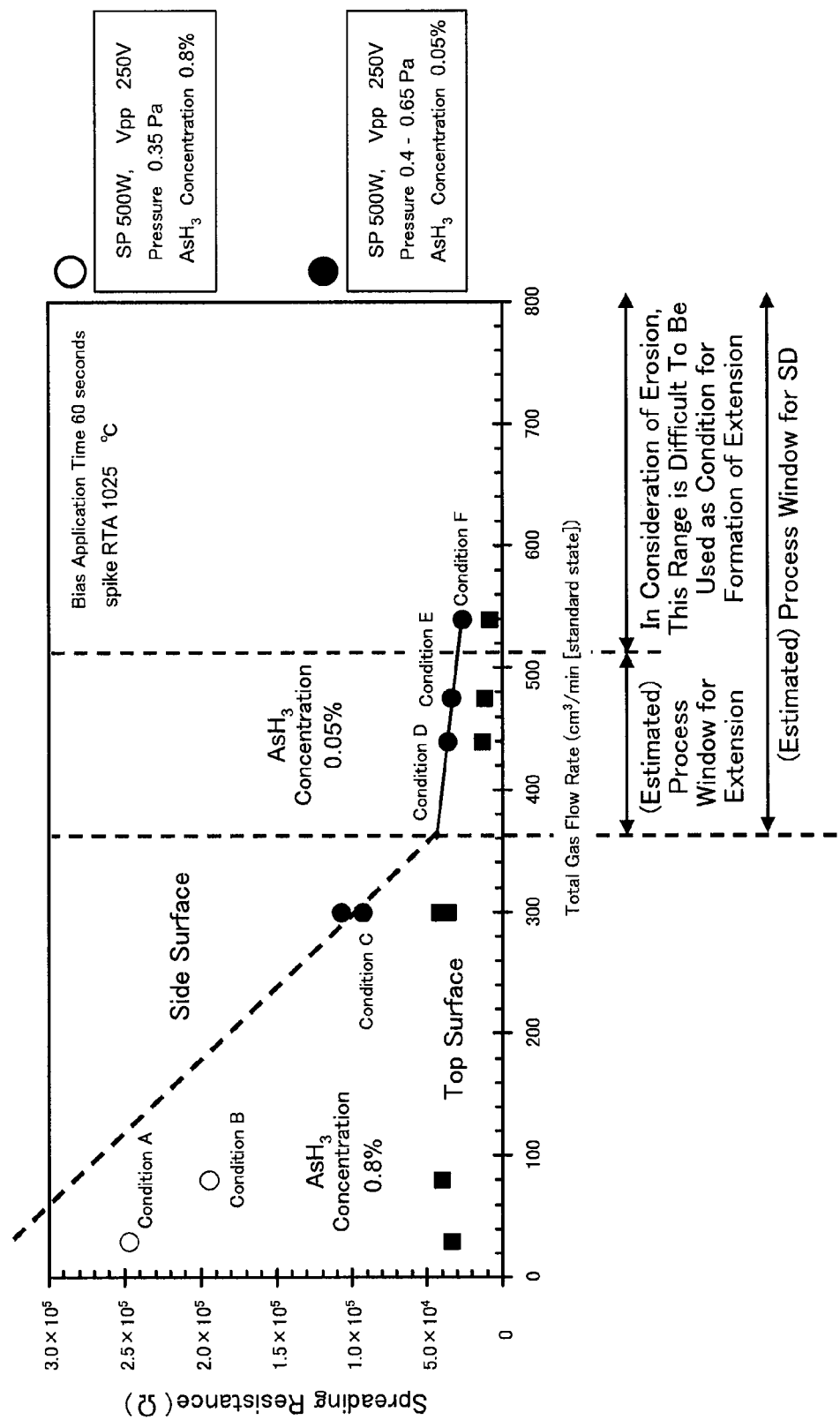
FIG. 8 is a graph illustrating the relationship between the total gas flow rate and the spreading resistance of a fin side surface.

In FIG. 7, the threshold at which the trend of As tending to enter the fin side surfaces changes was determined without consideration of the fact that while the AsH$_3$ concentration under the conditions C, D, E, and F was 0.05% by mass, the AsH$_3$ concentration under the conditions A and B was 0.8% by mass. However, if the AsH$_3$ concentration under the conditions A and B had been 0.05% by mass, the spreading resistance of a fin side surface provided by each of the conditions A and B would have been clearly higher than the above-mentioned corresponding value. Therefore, when the AsH$_3$ concentrations under the conditions A-F are standardized at 0.05% by mass, it is estimated that the threshold total gas flow rate at which the trend of As tending to enter the fin side surfaces changes will fall within the range of total gas flow rates of greater than 300 cm$^3$/min (standard state) and less than or equal to 400 cm$^3$/min (standard state) as illustrated in FIG. 8.

[Threshold Supply of AsH$_3$ Molecules and Threshold Supply of He Atoms]

Next, two parameters indicating the AsH$_3$ concentration and the AsH$_3$ flow rate were used in the characteristic equation of gas so as to be unified into one parameter as the supply of AsH$_3$ molecules (mol/min), and two parameters indicating the He concentration and the He flow rate were used in the characteristic equation of gas so as to be unified into one parameter as the supply of He atoms (mol/min), thereby evaluating the ease of introducing As into the fin side surfaces in terms of new parameters, i.e., the supply of AsH$_3$ molecules and the supply of He atoms. The evaluation results will be described below.

Specifically, the condition A was such that the AsH$_3$ concentration in the material gas was 0.8% by mass, the He concentration was 99.2% by mass, and the total flow rate of a combination of He and AsH$_3$ was 30 cm$^3$/min (standard state). This condition is equal to a situation where the supply of AsH$_3$ molecules is $5.54 \times 10^{-7}$ mol/min, and the supply of He atoms is $1.34 \times 10^{-3}$ mol/min.

The condition B was such that the AsH$_3$ concentration in the material gas was 0.8% by mass, the He concentration was 99.2% by mass, and the total flow rate of a combination of He and AsH$_3$ was 80 cm$^3$/min (standard state). This condition is equal to a situation where the supply of AsH$_3$ molecules is $1.48 \times 10^{-6}$ mol/min, and the supply of He atoms is $3.57 \times 10^{-3}$ mol/min.

The condition C was such that the AsH$_3$ concentration in the material gas was 0.05% by mass, the He concentration was 99.95% by mass, and the total flow rate of a combination of He and AsH$_3$ was 300 cm$^3$/min (standard state). This condition is equal to a situation where the supply of AsH$_3$ molecules is $3.44 \times 10^{-7}$ mol/min, and the supply of He atoms is $1.34 \times 10^{-2}$ mol/min.

The condition D was such that the AsH$_3$ concentration in the material gas was 0.05% by mass, the He concentration was 99.95% by mass, and the total flow rate of a combination of He and AsH$_3$ was 440 cm$^3$/min (standard state). This condition is equal to a situation where the supply of AsH$_3$ molecules is $5.04 \times 10^{-7}$ mol/min, and the supply of He atoms is $1.96 \times 10^{-2}$ mol/min.

The condition E was such that the AsH$_3$ concentration in the material gas was 0.05% by mass, the He concentration was 99.95% by mass, and the total flow rate of a combination of He and AsH$_3$ was 475 cm$^3$/min (standard state). This condition is equal to a situation where the supply of AsH$_3$ molecules is $5.44 \times 10^{-7}$ mol/min, and the supply of He atoms is $2.12 \times 10^{-2}$ mol/min.

The condition F was such that the AsH$_3$ concentration in the material gas was 0.05% by mass, the He concentration was 99.95% by mass, and the total flow rate of a combination of He and AsH$_3$ was 540 cm$^3$/min (standard state). This condition is equal to a situation where the supply of AsH$_3$ molecules is $6.19 \times 10^{-7}$ mol/min, and the supply of He atoms is $2.41 \times 10^{-2}$ mol/min.

In order to examine the influence of variations in the supply of AsH$_3$ molecules on the amount of As introduced into a fin side surface when the supply of He atoms are set at approximately the same value, samples were evaluated further using the condition G.

Here, the condition G was such that the AsH$_3$ concentration in the material gas was 0.025% by mass, the internal chamber pressure is 0.55 Pa, and the total flow rate of a combination of He and AsH$_3$ was 475 cm$^3$/min (standard state). Specifically, since the condition G was such that the AsH$_3$ concentration in the material gas was 0.025% by mass, the He concentration was 99.975% by mass, and the total flow rate of a combination of He and AsH$_3$ was 475 cm$^3$/min (standard state), this condition is equal to a situation where the supply of AsH$_3$ molecules is $2.72 \times 10^{-7}$ mol/min, and the supply of He atoms is $2.12 \times 10^{-2}$ mol/min.

When the condition G was used, the sheet resistance, the spreading resistance of the fin top surface, the spreading resistance of a fin side surface, and the amount of increase in the radius of curvature of a fin corner were 882 $\Omega$/sq., $2.9 \times 10^4 \Omega$, $1.49 \times 10^5 \Omega$, and 1.6 nm, respectively.

Figure 9:
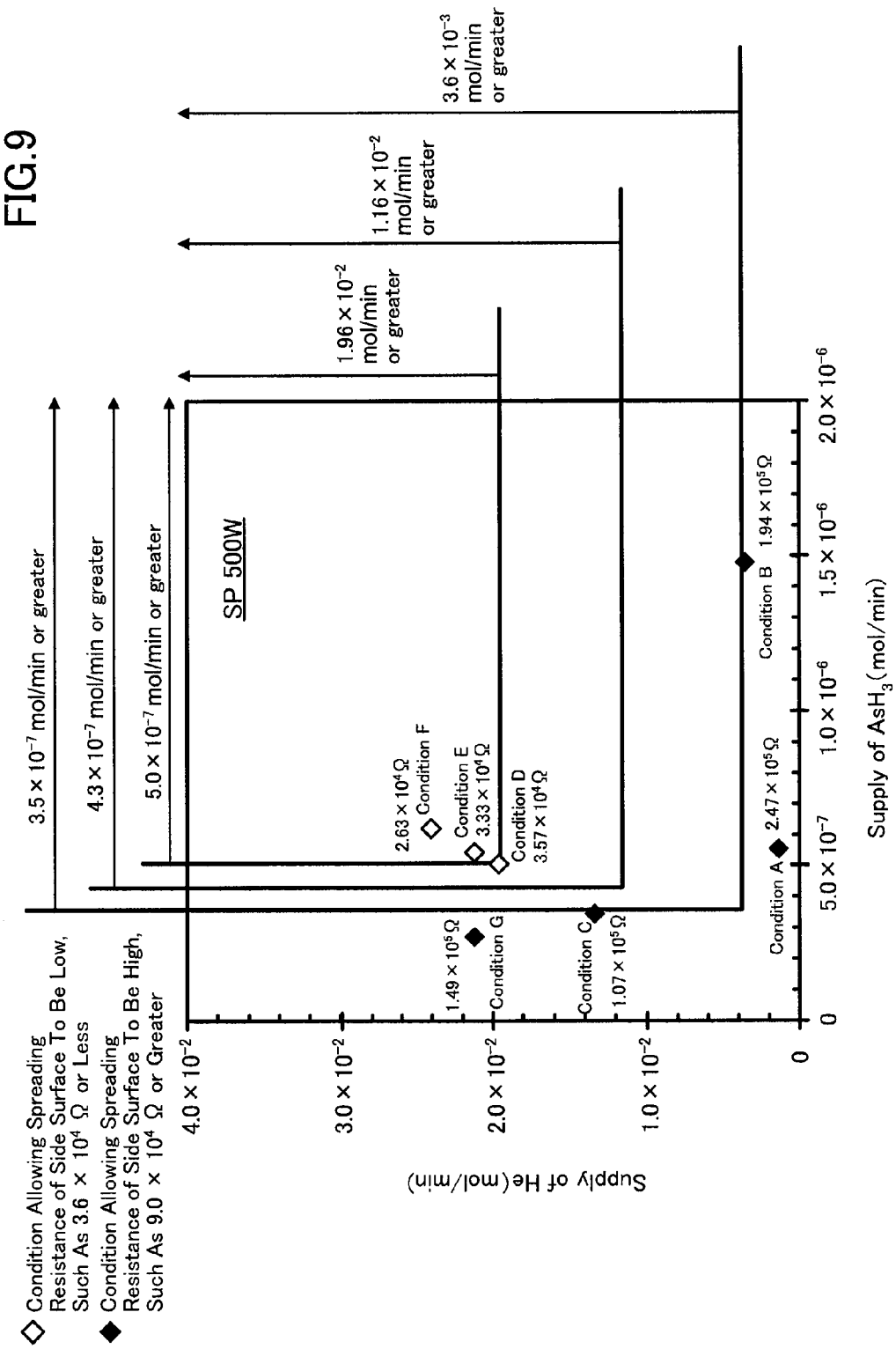
FIG. 9 is a graph illustrating the relationship between each of the supply of $AsH_3$ molecules and the supply of He atoms, and the spreading resistance of a fin side surface.

The results obtained under the conditions A-F and the result obtained under the condition G are estimated together below. FIG. 9 is a graph providing a summary of the results obtained under the conditions A-G.

As illustrated in FIG. 9, under each of the conditions D, E, and F, the spreading resistance of a fin side surface is low, such as less than or equal to $3.6 \times 10^4 \Omega$. By contrast, under each of the conditions A, B, C, and G, the spreading resistance of a fin side surface is higher than $9 \times 10^4 \Omega$. As such, when the condition D, E, or F is used, the spreading resistance of the fin side surface can be reduced to less than or equal to half the spreading resistance when the condition A, B, C, or G is used.

As illustrated in FIG. 9, comparisons between the cases where the conditions D, E, and F were used and the case where the condition G was used show that unless the supply of $AsH_3$ molecules is greater than a certain threshold, the spreading resistance of a fin side surface is not reduced even with approximately the same supply of He atoms. Here, the comparisons and the result under the condition C show that when the supply of $AsH_3$ molecules is at least greater than or equal to $3.5 \times 10^{-7}$ mol/min, the spreading resistance of the fin side surface can be reduced to less than or equal to $9 \times 10^4 \Omega$. Furthermore, the proportional distribution of the result under the condition C and the result under the condition D shows that when the supply of $AsH_3$ molecules is greater than or equal to $4.3 \times 10^{-7}$ mol/min, the spreading resistance of the fin side surface can be reduced to less than or equal to $6.3 \times 10^4 \Omega$. The result under the condition D shows that when the supply of $AsH_3$ molecules is greater than or equal to $5.0 \times 10^{-7}$ mol/min, the spreading resistance of the fin side surface can be reduced to less than or equal to $3.6 \times 10^4 \Omega$.

Furthermore, as illustrated in FIG. 9, comparisons between the cases where the conditions D, E, and F were used and the case where the condition A was used show that unless the supply of He atoms is greater than a certain threshold, the spreading resistance of a fin side surface is not reduced even with approximately the same supply of $AsH_3$ molecules. Here, the comparisons and the result under the condition B show that when the supply of He atoms is at least greater than or equal to $3.6 \times 10^{-3}$ mol/min, the spreading resistance of the fin side surface can be reduced to less than or equal to $9 \times 10^4 \Omega$. Furthermore, the proportional distribution of the result under the condition B and the result under the condition D shows that when the supply of He atoms is greater than or equal to $1.16 \times 10^{-2}$ mol/min, the spreading resistance of the fin side surface can be reduced to less than or equal to $6.3 \times 10^4 \Omega$. The result under the condition D shows that when the supply of He atoms is greater than or equal to $1.96 \times 10^{-2}$ mol/min, the spreading resistance of the fin side surface can be reduced to less than or equal to $3.6 \times 10^4 \Omega$.

Here, when attention is directed toward the result under the condition B, the supply of $AsH_3$ molecules under the condition B is much greater than the lower limit of the above-described strictest range of criteria (in which the spreading resistance of the fin side surface is reduced to less than or equal to $3.6 \times 10^4 \Omega$) of greater than or equal to $5.0 \times 10^{-7}$ mol/min. However, in this case, the spreading resistance of the fin side surface is high, such as $1.9 \times 10^5 \Omega$. This shows that even when only the supply of $AsH_3$ molecules meets the criteria range, the spreading resistance of the fin side surface cannot be reduced. The reason why the spreading resistance of the fin side surface under the condition B is high as described above is that the supply of He atoms is $3.57 \times 10^{-3}$ mol/min which is below the lower limit of the above-described strictest range of criteria. In other words, the supply of He atoms is insufficient. By contrast, since the condition D was such that the supply of $AsH_3$ molecules is $5.04 \times 10^{-7}$ mol/min, and the supply of He atoms is $1.96 \times 10^{-2}$ mol/min, the supply of $AsH_3$ molecules is above the lower limit of the above-described strictest range of criteria, i.e., $5.0 \times 10^{-7}$ mol/min, and simultaneously, the supply of He atoms also meets the lower limit of the above-described strictest range of criteria, i.e., $1.96 \times 10^{-2}$ mol/min. Therefore, the spreading resistance of the fin side surface can be low, such as $3.57 \times 10^4 \Omega$.

When, as described above, the supply of $AsH_3$ molecules and the supply of He atoms are both greater than or equal to respective certain thresholds, this facilitates introducing As into the fin side surfaces. Specifically, when the supply of $AsH_3$ molecules is greater than or equal to $5.0 \times 10^{-7}$ mol/min, and the supply of He atoms is greater than or equal to $1.96 \times 10^{-2}$ mol/min, the spreading resistance of a fin side surface can be lowest, such as less than or equal to $3.6 \times 10^{-4} \Omega$. Furthermore, when the supply of $AsH_3$ molecules is greater than or equal to $4.3 \times 10^{-7}$ mol/min, and the supply of He atoms is greater than or equal to $1.16 \times 10^{-2}$ mol/min, the spreading resistance of the fin side surface can be low, such as less than $6.3 \times 10^4 \Omega$. Moreover, when the supply of $AsH_3$ molecules is greater than or equal to $3.5 \times 10^{-7}$ mol/min, and the supply of He atoms is greater than or equal to $3.6 \times 10^{-3}$ mol/min, this allows the spreading resistance of the fin side surface to be close to the upper limit of the practically allowable range of less than $9.0 \times 10^4 \Omega$.

[Threshold Supply of $AsH_3$ Molecules and Threshold Supply of He Atoms Per Unit Time and Per Unit Volume]

Next, the results obtained by estimating the range of the conditions facilitating introducing As into the fin side surfaces in consideration of the chamber volume and the internal chamber pressure will be described.

Specifically, first, the supply of $AsH_3$ molecules (mol/min) and the supply of He atoms (mol/min) are each divided by the chamber volume (unit: liter (L)), and the thus-obtained parameters indicating the supply of $AsH_3$ molecules (mol/(min·L)) per unit volume and the supply of He atoms (mol/(min·L)) per unit volume were introduced.

Next, in order to make estimation in consideration of different pressures (internal chamber pressures) among samples, consideration was given to the time between the supply of a gas into the chamber and the emission of the gas (gas residence time). Here, the gas residence time T (second) was calculated by using the equation obtained by substituting 1 (cm$^3$/min (standard state))=$1.27 \times 10^{-2}$ (Torr·L/sec) derived from 1 (Torr·L/sec)=0.133 (Pa·m$^3$/sec) and 1 (Pa·m$^3$/sec)=592 (cm$^3$/min (standard state)) into T=V·P/Q (where the character V denotes the chamber volume (L), the character P denotes the pressure (Torr), and the character Q denotes the total gas flow rate (Torr·L/sec)), i.e., T=V·P/($1.27 \times 10^{-2}$·F) (where the character F denotes the total gas flow rate (cm$^3$/min (standard state)). Then, the supply of $AsH_3$ molecules (mol/(min·L)) per unit volume and the supply of He atoms (mol/(min·L)) per unit volume are each divided by the gas residence time, and the thus-obtained parameters indicating the supply of $AsH_3$ molecules (mol/(min·L·sec)) per unit time and per unit volume and the supply of He atoms (mol/(min·L·sec)) per unit time and per unit volume were introduced. These parameters enable identification of the range of the conditions facilitating introducing As into the fin side surfaces, and the range of the conditions is not dependent on the chamber volume and the chamber pressure.

The gas residence time, the supply of $AsH_3$ molecules per unit time and per unit volume, and the supply of He atoms per unit time and per unit volume under each of the above conditions will be described below.

Under the condition A, the gas residence time was 0.641 seconds, the supply of $AsH_3$ molecules per unit time and per unit volume was $9.30 \times 10^{-9}$ mol/(min·L·sec), and the supply of He atoms per unit time and per unit volume was $2.25 \times 10^{-5}$ mol/(min·L·sec).

Under the condition B, the gas residence time was 0.240 seconds, the supply of $AsH_3$ molecules per unit time and per unit volume was $6.63 \times 10^{-8}$ mol/(min·L·sec), and the supply of He atoms per unit time and per unit volume was $1.60 \times 10^{-4}$ mol/(min·L·sec).

Under the condition C, the gas residence time was 0.073 seconds, the supply of $AsH_3$ molecules per unit time and per unit volume was $5.05 \times 10^{-8}$ mol/(min·L·sec), and the supply of He atoms per unit time and per unit volume was $1.97 \times 10^{-3}$ mol/(min·L·sec).

Under the condition D, the gas residence time was 0.062 seconds, the supply of $AsH_3$ molecules per unit time and per unit volume was $8.69 \times 10^{-8}$ mol/(min·L·sec), and the supply of He atoms per unit time and per unit volume was $3.38 \times 10^{-3}$ mol/(min·L·sec).

Under the condition E, the gas residence time was 0.064 seconds, the supply of $AsH_3$ molecules per unit time and per unit volume was $9.20 \times 10^{-8}$ mol/(min·L·sec), and the supply of He atoms per unit time and per unit volume was $3.59 \times 10^{-3}$ mol/(min·L·sec).

Under the condition F, the gas residence time was 0.066 seconds, the supply of $AsH_3$ molecules per unit time and per unit volume was $1.01 \times 10^{-7}$ mol/(min·L·sec), and the supply of He atoms per unit time and per unit volume was $3.92 \times 10^{-3}$ mol/(min·L·sec).

Under the condition G, the gas residence time was 0.064 seconds, the supply of $AsH_3$ molecules per unit time and per unit volume was $4.6 \times 10^{-8}$ mol/(min·L·sec), and the supply of He atoms per unit time and per unit volume was $3.59 \times 10^{-3}$ mol/(min·L·sec).

Figure 10:
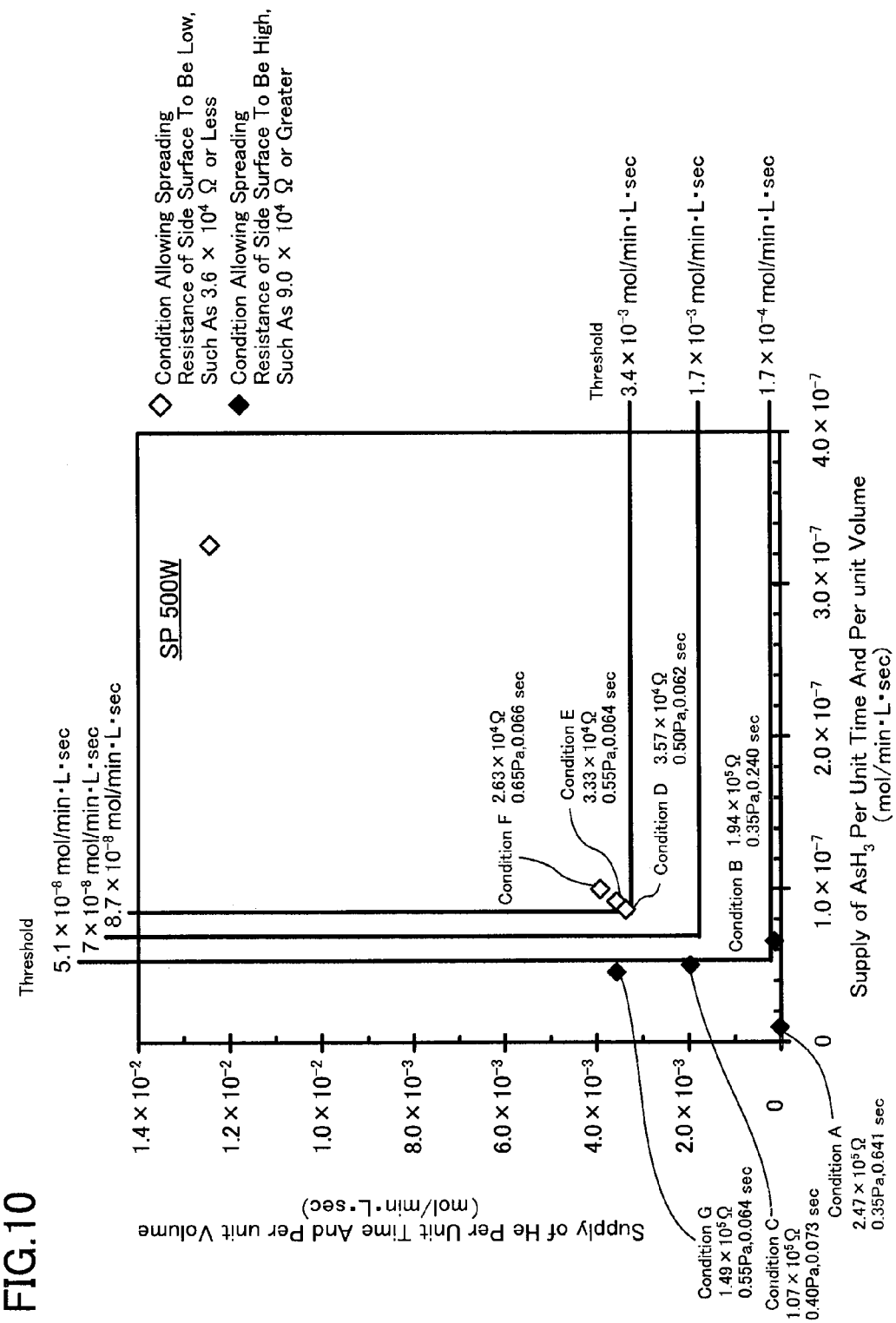
FIG. 10 is a graph illustrating the relationship between each of the supply of $AsH_3$ molecules and the supply of He atoms per unit time and per unit volume, and the spreading resistance of a fin side surface.

FIG. 10 is a graph providing a summary of the results obtained under the conditions A-G by using the supply of $AsH_3$ molecules and the supply of He atoms per unit time and per unit volume as parameters.

As illustrated in FIG. 10, comparisons between the results obtained under the conditions D, E, and F and the result obtained under the condition G show that unless the supply of $AsH_3$ molecules per unit time and per unit volume is greater than or equal to a certain threshold, a sufficient amount of arsenic cannot be introduced into a fin side surface even with approximately the same supply of He atoms per unit time and per unit volume.

Furthermore, as illustrated in FIG. 10, comparisons between the results obtained under the conditions D, E, and F and the result obtained under the condition B show that unless the supply of He atoms per unit time and per unit volume is greater than or equal to a certain threshold, a sufficient amount of arsenic cannot be introduced into a fin side surface even with approximately the same supply of $AsH_3$ molecules per unit time and per unit volume.

Specifically, the result under the condition D shows that when the supply of $AsH_3$ molecules per unit time and per unit volume is greater than or equal to approximately $8.7 \times 10^{-8}$ mol/(min·L·sec), and the supply of He atoms per unit time and per unit volume is greater than or equal to approximately $3.4 \times 10^{-3}$ mol/(min·L·sec), the spreading resistance of a fin side surface can be lowest, such as less than or equal to $3.6 \times 10^4 \Omega$.

Furthermore, it can be seen that when the supply of $AsH_3$ molecules per unit time and per unit volume is set greater than or equal to approximately $7.0 \times 10^{-8}$ mol/(min·L·sec) based on the proportional distribution of the result under the condition D and the result under the condition C, and the supply of He atoms per unit time and per unit volume is set greater than or equal to approximately $1.7 \times 10^{-3}$ mol/(min·L·sec) based on the proportional distribution of the result under the condition D and the result under the condition B, the spreading resistance of a fin side surface can be low, such as less than or equal to $6.3 \times 10^4 \Omega$.

Moreover, when the supply of $AsH_3$ molecules per unit time and per unit volume is set greater than or equal to approximately $5.1 \times 10^{-8}$ mol/(min·L·sec) based on the result under the condition C, and the supply of He atoms per unit time and per unit volume is set greater than or equal to approximately $1.7 \times 10^{-4}$ mol/(min·L·sec) based on the result under the condition B, this allows the spreading resistance of the fin side surface to be close to the upper limit of the practically allowable range of less than $9.0 \times 10^4 \Omega$.

[Reduction in Amount of Chipping of Fin Corner Portion]

Next, the relationship between the internal chamber pressure and the amount of chipping of a fin corner portion will be described with reference to the drawings.

Figure 11A:
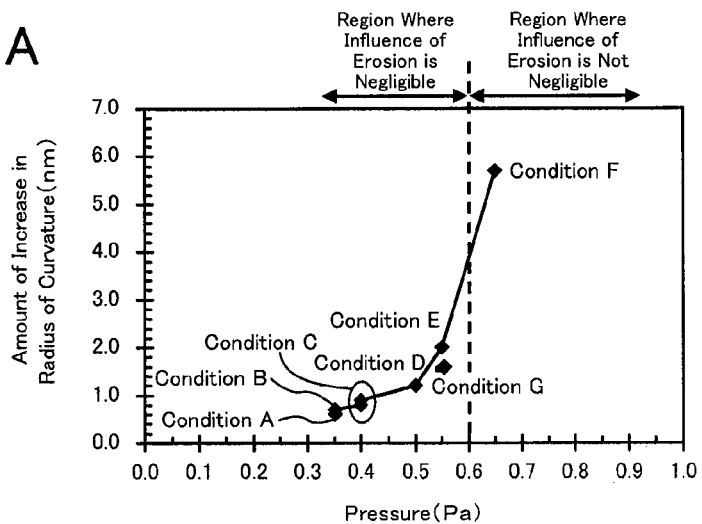
FIG. 11A is a graph illustrating the internal chamber pressure and the amount of chipping of a fin corner portion.

FIG. 11A illustrates the relationship between the internal chamber pressure and the amount of chipping of the fin corner potion under each of the above conditions. Here, chipping of a fin corner portion due to plasma doping is referred to as erosion.

Figure 11B:
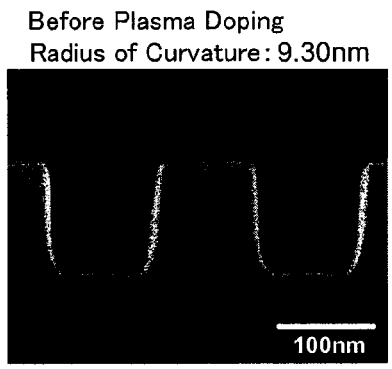
FIG. 11B is a diagram illustrating fin corner portions before plasma doping.
Figure 11C:
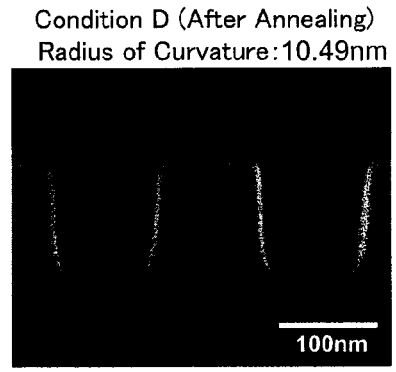
FIGS. 11C-11E are diagrams illustrating fin corner portions after annealing subsequent to plasma doping.
Figure 11D:
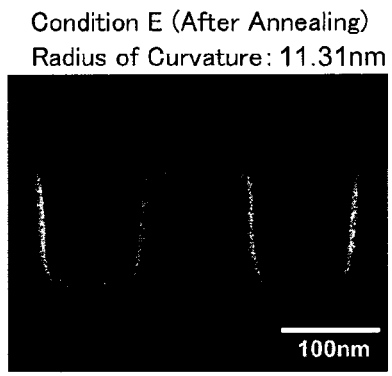

As described above, each of the conditions D and E was such that the internal chamber pressure was set low, i.e., at 0.5-0.55 Pa. As illustrated in FIG. 11B, the radius of curvature of a fin corner portion before plasma doping was approximately 9.3 nm. By contrast, as illustrated in FIGS. 11C and 11D, the radius of curvature of a fin corner portion after annealing subsequent to plasma doping under the condition D was approximately 10.5 nm, and the radius of curvature of a fin corner portion after annealing subsequent to plasma doping under the condition E was approximately 11.3 nm. Therefore, as illustrated in FIG. 11A, the use of either of the conditions D and E reduces the amount of increase in the radius of curvature to less than or equal to 2 nm. This advantage is provided by setting the internal chamber pressure at a low pressure of less than or equal to 0.6 Pa. As described above, when the condition D or E is used, a desired amount of arsenic can be introduced into a fin side surface.

By contrast, assume that when arsenic ions are implanted into fin-type semiconductor regions, a plurality of fin-type semiconductor regions are aligned. In this case, a small implantation angle (e.g., an implantation angle of less than or equal to 25 degrees) is used. In such a case, when the As implantation energy is high, the amount of chipping of a fin corner portion is large, such as approximately 2.4-4.2 nm, and even when the As implantation energy is low, the amount of chipping of a fin corner portion is approximately 2.2 nm.

Therefore, the above condition D or E allowing the amount of chipping (the amount of increase in the radius of curvature) to be less than or equal to 2 nm is preferably used to form extension regions of a fin-FET (see FIG. 7).

Figure 11E:
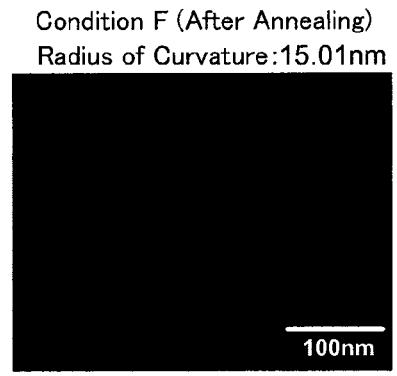

By contrast, under the condition F, the radius of curvature of a fin corner portion after plasma doping using the condition F and annealing was approximately 15.0 nm as illustrated in FIG. 11E due to the fact that the pressure was set slightly higher, such as 0.65 Pa. Here, since, as described above, the radius of curvature of a fin corner portion before plasma doping was 9.3 nm, the amount of increase in the radius of curvature when the condition F was used reaches a value as large as 5.7 nm as illustrated in FIG. 11A. It is difficult to use the condition causing such a large amount of chipping to form extension regions (see FIG. 7). However, when such a condition is used to form source/drain regions, this presents no particular problem as long as a process in which the size of portions of the fin-type semiconductor regions corresponding to the source/drain regions is increased, etc., is performed (see FIG. 7).

As described above, when the condition F is used, a desired amount of As can be introduced into a fin side surface. However, the amount of chipping of a fin corner portion under the condition F is large enough to make it difficult to use the condition F to form extension regions.

The internal chamber pressures under the conditions A, B, and C are set at low levels of less than or equal to 0.6 Pa, such as 0.35-0.4 Pa, and thus, as illustrated in FIG. 11A, the use of any one of the conditions A, B, and C reduces the amount of chipping of a fin corner portion to a very low level, such as less than or equal to 1 nm. However, as described above, the use of any one of the conditions A, B, and C prevents a desired amount of As from being introduced into a fin side surface.

As described above, in order to provide low-resistance extension regions while reducing the amount of chipping of a fin corner portion in the fabrication of a fin-FET, the supply of $AsH_3$ molecules per unit time and per unit volume is preferably set greater than or equal to approximately $5.1\times10^{-8}$ mol/(min·L·sec), the supply of He atoms per unit time and per unit volume is preferably set greater than or equal to approximately $1.7\times10^{-4}$ mol/(min·L·sec), and the internal chamber pressure is preferably set less than or equal to 0.6 Pa.

In the fabrication of a double gate fin semiconductor device, an upper portion of a fin-type semiconductor region is covered with a hard mask, thereby relaxing restrictions on chipping (erosion) of upper corners of the fin-type semiconductor region due to plasma doping. Therefore, the pressure during plasma doping may be higher than 0.6 Pa. In the formation of source/drain regions, when a process in which the size of portions of the fin-type semiconductor regions corresponding to the source/drain regions is increased, etc., is performed as described above, the pressure during plasma doping can be higher than 0.6 Pa even with a triple gate fin semiconductor device.

[Influence of Source Power on Threshold Supply of $AsH_3$ Molecules and Threshold Supply of He Atoms]

Next, the results obtained by estimating the influence of the source power (SP) on the amount of As introduced into a fin side surface will be described.

A sample was evaluated using the condition H under which the magnitude of the source power is different from that under each of the above conditions A-G. The condition H was set such that the $AsH_3$ concentration in the material gas was 0.05% by mass, the internal chamber pressure was 0.55 Pa, the total flow rate of a combination of He and $AsH_3$ was 475 cm$^3$/min (standard state), and the SP was 250 W.

Specifically, the sample was subjected to plasma doping under the condition H, and then subjected to annealing (specifically, spike RTA at 1025° C.), and thereafter, the spreading resistance and erosion on a fin corner portion were measured by SSRM and SEM observation, respectively. Furthermore, the flat principal surface of a silicon substrate was subjected to plasma doping under the condition H separately, the silicon substrate was then subjected to annealing (specifically, spike RTA at 1025° C.), and thereafter, the sheet resistance was measured using a four-point probe technique.

Consequently, under the condition H, the sheet resistance, the spreading resistance of the fin top surface, the spreading resistance of a fin side surface, and the amount of increase in the radius of curvature of a fin corner portion were obtained as described below.

Specifically, under the condition H, the sheet resistance was 524 Ω/sq., the spreading resistance of the fin top surface was $2.2\times10^4$Ω, the spreading resistance of the fin side surface was $5.53\times10^4$Ω, and the amount of increase in the radius of curvature of the fin corner portion was 1.5 nm.

Here, when the condition H is compared with the condition E, these conditions are different only in SP. Specifically, while the SP under the condition E was 500 W, the SP under the condition H was set low, such as half of the SP under the condition E, i.e., 250 W. Next, the result under the condition H and the result under the condition E are compared with each other. While the sheet resistance of the fin top surface under the condition H was 524 Ω/sq., the sheet resistance of the fin top surface under the condition E was 500 Ω/sq. Thus, the sheet resistance of the fin top surface under the condition E is approximately 5% lower than that under the condition H. Furthermore, while the spreading resistance of the fin top surface under the condition H was $2.2\times10^4$Ω, the spreading resistance of the fin top surface under the condition E was $1.1\times10^4$Ω. Thus, the spreading resistance of the fin top surface under the condition E is approximately 50% lower than that under the condition H. Moreover, while the spreading resistance of a fin side surface under the condition H was approximately $5.5\times10^4$Ω, the spreading resistance of a fin side surface under the condition E was $3.3\times10^4$Ω. Thus, the spreading resistance of the fin side surface under the condition E is approximately 40% lower than that under the condition H.

The above results show that with an increase in the SP, the amount of As introduced into each of the fin side surfaces and the fin top surface increases. This indicates that with an increase in the SP, the supply of the material gas ($AsH_3$ and He) needed to introduce a desired amount of As into a fin side surface decreases.

The above-described comparison between the result under the condition H and the result under the condition E shows that the spreading resistance of a fin side surface is reduced by 40% (i.e., to 0.6 times its original value) by doubling the SP from 250 W to 500 W. When the supply of the material gas is set at the same value, an increase in SP will increase a substantial supply of the material gas. Therefore, when the SP is set at 1000 W, the spreading resistance of the fin side surface will be further reduced by 40% of the spreading resistance when the SP is set at 500 W (i.e., to 0.6 times the spreading resistance when the SP is set at 500 W).

By contrast, referring to the supplies of the material gases in FIG. 10, when the supply of $AsH_3$ molecules per unit time and per unit volume is increased from $5.1\times10^{-8}$ mol/(min·L·sec) to $8.7\times10^{-8}$ mol/(min·L·sec), i.e., 1.7 times its original value, and the supply of He atoms per unit time and per unit volume is increased from $1.7\times10^{-4}$ mol/(min·L·sec) to $3.4\times10^{-3}$ mol/(min·L·sec), i.e., 20 times its original value, this reduces the spreading resistance of a fin side surface from $9.0\times10^4$Ω to $3.6\times10^4$Ω by 60% (i.e., to 0.4 times its original value).

Specifically, while the spreading resistance of a fin side surface can be reduced by 40% (to 0.6 times its original value) by doubling the SP, the spreading resistance of the fin side surface can be reduced by 60% (to 0.4 times its original value) by increasing the supply of $AsH_3$ molecules per unit time and per unit volume to 1.7 times its original value and increasing the supply of He atoms per unit time and per unit volume to 20 times its original value.

Here, a case where the spreading resistance of a fin side surface is reduced by 90% (to 0.1 times its original value) by adjusting the SP, the supply of $AsH_3$ molecules per unit time and per unit volume, and the supply of He atoms per unit time and per unit volume will be considered.

The equation "$0.6^A=0.1$" holds, and thus, $A\approx4.51$. Therefore, the spreading resistance of a fin side surface can be reduced by 90% (to 0.1 times its original value) by increasing the SP to $2^{4.51}$ times its original value. By contrast, the equation "$0.4^B=0.1$" holds, and thus, $B\approx2.51$. Therefore, the spreading resistance of the fin side surface can be reduced by 90% (to 0.1 times its original value) by increasing the supply of $AsH_3$ molecules per unit time and per unit volume to $1.7^{2.51}$ times its original value and increasing the supply of He atoms per unit time and per unit volume to $20^{2.51}$ times its original value. Therefore, the increase of the SP to $2^{4.51}$ times the original SP is equal to a situation where the supply of $AsH_3$ molecules per unit time and per unit volume and the supply of He atoms per unit time and per unit volume are increased to $1.7^{2.51}$ times and $20^{2.51}$ times, respectively, their corresponding original values.

Next, a case where the SP is Y (W) will be considered. The source power Y (W) is Y/500 times as high as 500 W. Therefore, the setting of the SP at Y/500 times its original value is equal to the following situation: the supply of $AsH_3$ molecules per unit time and per unit volume is $(1.7^{2.51}/2^{4.51}) \times (Y/500)$ times as large as its original value; and the supply of He atoms per unit time and per unit volume is $(20^{2.51}/2^{4.51}) \times (Y/500)$ times as large as its original value.

Therefore, the supply of $AsH_3$ molecules per unit time and per unit volume needed to allow the spreading resistance to be less than $9.0 \times 10^4 \Omega$ when the SP is Y (W) is $5.1 \times 10^{-8}/((1.7^{2.51}/2^{4.51}) \times (Y/500))$ (mol/(min·L·sec)), which is obtained by dividing the supply of $AsH_3$ molecules per unit time and per unit volume needed to allow the spreading resistance to be less than $9.0 \times 10^4 \Omega$ when the SP is 500 W, i.e., $5.1 \times 10^{-8}$ mol/(min·L·sec), by $(1.7^{2.51}/2^{4.51}) \times (Y/500)$. The supply of He atoms per unit time and per unit volume needed to allow the spreading resistance to be less than $9.0 \times 10^4 \Omega$ when the SP is Y (W) is $1.7 \times 10^{-4}/((20^{2.51}/2^{4.51}) \times (Y/500))$ (mol/(min·L·sec)), which is obtained by dividing the supply of He atoms per unit time and per unit volume needed to allow the spreading resistance to be less than $9.0 \times 10^4 \Omega$ when the SP is 500 W, i.e., $1.7 \times 10^{-4}$ mol/(min·L·sec), by $(20^{2.51}/2^{4.51}) \times (Y/500)$. The use of the above supply of $AsH_3$ molecules per unit time and per unit volume and the above supply of He atoms per unit time and per unit volume allows the spreading resistance of a fin side surface to be close to the upper limit of the practically allowable range of less than $9.0 \times 10^4 \Omega$.

Similarly, the supply of $AsH_3$ molecules per unit time and per unit volume needed to allow the spreading resistance to be less than or equal to $6.3 \times 10^4 \Omega$ when the SP is Y (W) is $7 \times 10^{-8}/((1.7^{2.51}/2^{4.51}) \times (Y/500))$ (mol/(min·L·sec)), which is obtained by dividing the supply of $AsH_3$ molecules per unit time and per unit volume needed to allow the spreading resistance to be less than or equal to $6.3 \times 10^4 \Omega$ when the SP is 500 W, i.e., $7 \times 10^{-8}$ mol/(min·L·sec), by $(1.7^{2.51}/2^{4.51}) \times (Y/500)$. The supply of He atoms per unit time and per unit volume needed to allow the spreading resistance to be less than or equal to $6.3 \times 10^4 \Omega$ when the SP is Y (W) is $1.7 \times 10^{-3}/((20^{2.51}/2.451) \times (Y/500))$ (mol/(min·L·sec)), which is obtained by dividing the supply of He atoms per unit time and per unit volume needed to allow the spreading resistance to be less than $6.3 \times 10^4 \Omega$ when the SP is 500 W, i.e., $1.7 \times 10^{-3}$ mol/(min·L·sec), by $(20^{2.51}/2^{4.51}) \times (Y/500)$. The use of the above supply of $AsH_3$ molecules per unit time and per unit volume and the above supply of He atoms per unit time and per unit volume allows the spreading resistance of a fin side surface to be low, such as less than $6.3 \times 10^4 \Omega$.

Similarly, the supply of $AsH_3$ molecules per unit time and per unit volume needed to allow the spreading resistance to be less than or equal to $3.6 \times 10^4 \Omega$ when the SP is Y (W) is $8.7 \times 10^{-8}/((1.7^{2.51}/2^{4.51}) \times (Y/500))$ (mol/(min·L·sec)), which is obtained by dividing the supply of $AsH_3$ molecules per unit time and per unit volume needed to allow the spreading resistance to be less than or equal to $3.6 \times 10^4 \Omega$ when the SP is 500 W, i.e., $8.7 \times 10^{-8}$ mol/(min·L·sec), by $(1.7^{2.51}/2^{4.51}) \times (Y/500)$. The supply of He atoms per unit time and per unit volume needed to allow the spreading resistance to be less than or equal to $3.6 \times 10^4 \Omega$ when the SP is Y (W) is $3.4 \times 10^{-3}/((20^{2.51}/2^{4.51}) \times (Y/500))$ (mol/(min·L·sec)), which is obtained by dividing the supply of He atoms per unit time and per unit volume needed to allow the spreading resistance to be less than $3.6 \times 10^4 \Omega$ when the SP is 500 W, i.e., $3.4 \times 10^{-3}$ mol/(min·L·sec), by $(20^{2.51}/2^{4.51}) \times (Y/500)$. The use of the above supply of $AsH_3$ molecules per unit time and per unit volume and the above supply of He atoms per unit time and per unit volume allows the spreading resistance of a fin side surface to be lowest, such as less than $3.6 \times 10^4 \Omega$.

[Upper Limit of Supply of $AsH_3$ Molecules]

The desired upper limit of the supply of $AsH_3$ molecules per unit time and per unit volume will be described hereinafter with reference to the drawings.

First, in order to examine the influence of the supply of $AsH_3$ molecules on the amount of As introduced into a fin side surface, samples were evaluated using the condition E and new conditions I, J, and K with different supplies of $AsH_3$ molecules.

The condition E was such that the $AsH_3$ concentration in the material gas was 0.05% by mass, the He concentration was 99.95% by mass, and the total flow rate of a combination of He and $AsH_3$ was 475 cm³/min (standard state). As described above, this condition is equal to a situation where the supply of $AsH_3$ molecules per unit time and per unit volume is $9.20 \times 10^{-8}$ mol/(min·L·sec), and the supply of He atoms per unit time and per unit volume is $3.59 \times 10^{-3}$ mol/(min·L·sec).

The condition I was such that the $AsH_3$ concentration in the material gas was 0.5% by mass, the He concentration was 99.5% by mass, and the total flow rate of a combination of He and $AsH_3$ was 475 cm³/min (standard state). This condition is equal to a situation where the supply of $AsH_3$ molecules per unit time and per unit volume is $9.25 \times 10^{-7}$ mol/(min·L·sec), and the supply of He atoms per unit time and per unit volume is $3.59 \times 10^{-3}$ mol/(min·L·sec).

The condition J was such that the $AsH_3$ concentration in the material gas was 1.0% by mass, the He concentration was 99.0% by mass, and the total flow rate of a combination of He and $AsH_3$ was 475 cm³/min (standard state). This condition is equal to a situation where the supply of $AsH_3$ molecules per unit time and per unit volume is $1.86 \times 10^{-6}$ mol/(min·L·sec), and the supply of He atoms per unit time and per unit volume is $3.58 \times 10^{-3}$ mol/(min·L·sec).

The condition K was such that the $AsH_3$ concentration in the material gas was 3.0% by mass, the He concentration was 97.0% by mass, and the total flow rate of a combination of He and $AsH_3$ was 475 cm³/min (standard state). This condition is equal to a situation where the supply of $AsH_3$ molecules per unit time and per unit volume is $5.68 \times 10^{-6}$ mol/(min·L·sec), and the supply of He atoms per unit time and per unit volume is $3.59 \times 10^{-3}$ mol/(min·L·sec).

Furthermore, the flat principal surface of a silicon substrate used as a sample was examined by using a new condition L.

The condition L was such that the $AsH_3$ concentration in the material gas was 5.0% by mass, the He concentration was 95.0% by mass, and the total flow rate of a combination of He and $AsH_3$ was 475 cm³/min (standard state). This condition is equal to a situation where the supply of $AsH_3$ molecules per unit time and per unit volume is $9.66 \times 10^{-6}$ mol/(min·L·sec), and the supply of He atoms per unit time and per unit volume is $3.57 \times 10^{-3}$ mol/(min·L·sec).

The above-described conditions are all such that the material gas is $AsH_3$ diluted with He, the source power (the plasma-generating high-frequency power) is 500 W, the bias voltage Vpp is 250 V, the substrate temperature is 22° C., the plasma doping time is 60 seconds, and the chamber volume is 93 L.

Each sample was subjected to plasma doping under the above corresponding condition, and then subjected to annealing (specifically, spike RTA at 1025° C.), and thereafter, the spreading resistance and erosion on a fin corner portion were measured by SSRM and SEM observation, respectively. Furthermore, the flat principal surfaces of silicon substrates were subjected to plasma doping under the above corresponding conditions separately, the silicon substrates were then subjected to annealing (specifically, spike RTA at 1025° C.), and thereafter, the sheet resistances were measured using a four-point probe technique.

Consequently, under each of the conditions, the sheet resistance, the spreading resistance of the fin top surface, the spreading resistance of a fin side surface, and the amount of increase in the radius of curvature of a fin corner portion were obtained as described below. However, under the condition L, only the flat principal surface of the corresponding silicon substrate was examined.

Under the condition E, the sheet resistance was 500 Ω/sq., the spreading resistance of the fin top surface was $1.1 \times 10^4 \Omega$, the spreading resistance of the fin side surface was $3.3 \times 10^4 \Omega$, and the amount of increase in the radius of curvature of a fin corner portion was 2.0 nm.

Under the condition I, the sheet resistance was 340 Ω/sq., the spreading resistance of the fin top surface was $3.0 \times 10^3 \Omega$, the spreading resistance of the fin side surface was $7.5 \times 10^3 \Omega$, and the amount of increase in the radius of curvature of a fin corner portion was 1.2 nm.

Under the condition J, the sheet resistance was 342 Ω/sq., the spreading resistance of the fin top surface was $3.6 \times 10^3 \Omega$, the spreading resistance of the fin side surface was $9.1 \times 10^3 \Omega$, and the amount of increase in the radius of curvature of a fin corner portion was 1.5 nm.

Under the condition K, the sheet resistance was 345 Ω/sq., the spreading resistance of the fin top surface was $2.6 \times 10^3 \Omega$, the spreading resistance of the fin side surface was $8.1 \times 10^3 \Omega$, and the amount of increase in the radius of curvature of a fin corner portion was 3.7 nm.

Under the condition L, the sheet resistance measured on the flat principal surface of the silicon substrate was unstable, thereby making the formation itself of an impurity layer difficult.

FIG. 12 is a table providing a summary of the conditions described above and the results obtained under these conditions. As illustrated in FIG. 12, on the conditions E, I, J, K, and L, parameters other than the supply of $AsH_3$ molecules per unit time and per unit volume were set at substantially the same values, and the supply of $AsH_3$ molecules per unit time and per unit volume was varied within the range of greater than or equal to $9.20 \times 10^{-8}$ mol/(min·L·sec) and less than or equal to $9.66 \times 10^{-6}$ mol/(min·L·sec).

Figure 13:
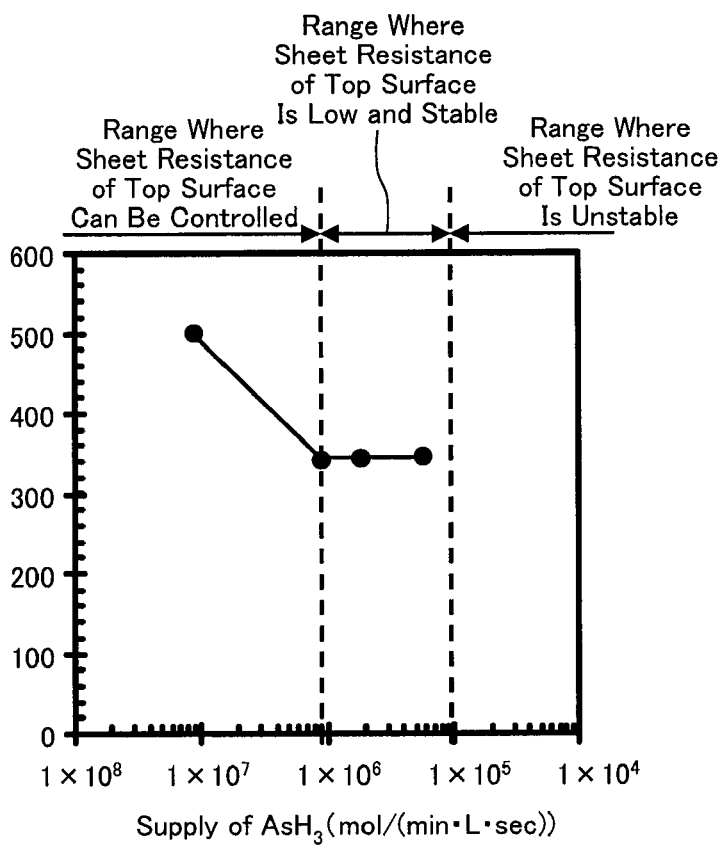
FIG. 13 is a graph illustrating the relationship between the supply of $AsH_3$ molecules per unit time and per unit volume and the sheet resistance measured on the flat principal surface of a silicon substrate.

FIG. 13 illustrates the relationship between the supply of $AsH_3$ molecules per unit time and per unit volume under each of the conditions E, I, J, and K and the sheet resistance measured on the flat principal surface of the corresponding silicon substrate. Here, the sheet resistance measured on the flat principal surface of the silicon substrate can be estimated to be identical with the sheet resistance of the fin top surface. As illustrated in FIG. 13, when the supply of $AsH_3$ molecules per unit time and per unit volume was increased in the range of greater than or equal to $9.20 \times 10^{-8}$ mol/(min·L·sec), the sheet resistance of the fin top surface decreased. However, when the supply of $AsH_3$ molecules per unit time and per unit volume reached $9.25 \times 10^{-7}$ mol/(min·L·sec), the decrease in the sheet resistance of the fin top surface was saturated. The sheet resistance of the fin top surface was low and stable in the range in which the supply of $AsH_3$ molecules per unit time and per unit volume was greater than or equal to $9.25 \times 10^{-7}$ mol/(min·L·sec). However, when the supply of $AsH_3$ molecules was increased to $9.66 \times 10^{-6}$ mol/(min·L·sec), this caused a phenomenon in which the sheet resistance of the fin top surface significantly varied among samples, and was unstable. A possible cause of this phenomenon is that a thick deposition layer of arsenic was formed on the silicon surface by excessively increasing the supply of $AsH_3$ molecules. Since, in particular, arsenic tends to be oxidized by being exposed to the atmosphere, a thick oxide of arsenic was probably formed on the silicon surface, leading to variations in the sheet resistance.

Figure 14:
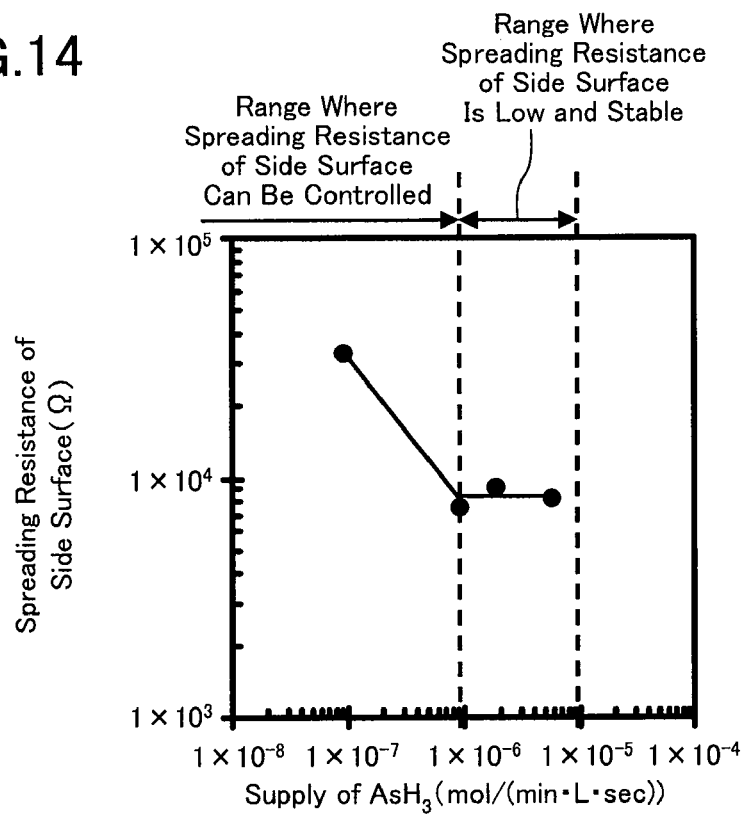
FIG. 14 is a graph illustrating the relationship between the supply of $AsH_3$ molecules per unit time and per unit volume and the spreading resistance of a fin side surface.

FIG. 14 illustrates the relationship between the supply of $AsH_3$ molecules per unit time and per unit volume under each of the conditions E, I, J, and K and the spreading resistance of a fin side surface. As illustrated in FIG. 14, similarly to the case illustrated in FIG. 13, when the supply of $AsH_3$ molecules per unit time and per unit volume was increased in the range of greater than or equal to $9.20 \times 10^{-8}$ mol/(min·L·sec), the spreading resistance of the fin side surface decreased. However, when the supply of $AsH_3$ molecules per unit time and per unit volume reached $9.25 \times 10^7$ mol/(min·L·sec), the decrease in the spreading resistance of the fin side surface was saturated. The spreading resistance of the fin side surface was low and stable in the range in which the supply of $AsH_3$ molecules per unit time and per unit volume was greater than or equal to $9.25 \times 10^{-7}$ mol/(min·L·sec).

As described above, after considering all the results illustrated in FIGS. 13 and 14, when the supply of $AsH_3$ molecules per unit time and per unit volume is set greater than or equal to at least $9.20 \times 10^{-8}$ mol/(min·L·sec), the sheet resistance of the fin top surface and the spreading resistance of a fin side surface can be controlled to low levels. In particular, when the supply of $AsH_3$ molecules per unit time and per unit volume is set in the range of greater than or equal to $9.25 \times 10^{-7}$ mol/(min·L·sec) and less than $9.66 \times 10^{-6}$ mol/(min·L·sec), the sheet resistance of the fin top surface and the spreading resistance of the fin side surface can be extremely low and stable. However, when the supply of $AsH_3$ molecules per unit time and per unit volume is set greater than or equal to $9.66 \times 10^{-6}$ mol/(min·L·sec), the following phenomenon occurs: arsenic is excessively deposited in an amount exceeding the acceptable amount, thereby making the sheet resistance of the fin top surface unstable. For a similar reason, it is estimated that when the supply of $AsH_3$ molecules per unit time and per unit volume is set greater than or equal to $9.66 \times 10^{-6}$ mol/(min·L·sec), the spreading resistance of the fin side surface is also unstable.

Therefore, the supply of $AsH_3$ molecules per unit time and per unit volume is preferably set less than $9.66 \times 10^{-6}$ mol/(min·L·sec). Similarly to the above section "Influence of Source Power on Threshold Supply of $AsH_3$ Molecules and Threshold Supply of He Atoms," in consideration of the source power dependence, when the source power is Y (W), the supply of $AsH_3$ molecules per unit time and per unit volume is preferably set less than $9.66 \times 10^{-6}/((1.7^{2.51}/2^{4.51}) \times (Y/500))$ mol/(min·L·sec).

[Upper Limit of Amount of He Atoms]

The desired upper limit of the amount of He atoms per unit time and per unit volume will be described hereinafter with reference to the drawings.

The supply of He atoms is determined by the internal chamber pressure, the exhaust capacity of the chamber, and the chamber volume. A case where the exhaust capacity of the chamber is 2700 L/second, and the chamber volume is 93 L will be described hereinafter as an example.

FIG. 11 shows that the use of the supply of He atoms allowing the internal chamber pressure to be less than or equal to 0.6 Pa can reduce erosion (chipping of a fin corner portion) to a low level of less than 4 nm. This enables the formation of a triple gate FET. Here, the supply of He atoms per unit time and per unit volume allowing the internal chamber pressure to be 0.6 Pa is $3.8 \times 10^{-3}$ mol/(min·L·sec). The supply of He atoms per unit time and per unit volume allowing the internal chamber pressure to be 0.6 Pa hardly varies even when the supply of $AsH_3$ molecules per unit time and per unit volume varies within the range of less than or equal to $1\times10^{-5}$ mol/(min·L·sec).

Therefore, the supply of He atoms per unit time and per unit volume is preferably set less than or equal to $3.8\times10^{-3}$ mol/(min·L·sec).

Incidentally, when a double gate FET in which the fin top surface is covered with a hard mask is formed, the fin top surface is protected by the hard mask, thereby relaxing restrictions on the condition determined under consideration of erosion. Specifically, the desired upper limit of the supply of He atoms is greater than that when a triple gate FET is formed. Therefore, in order to examine desired conditions for forming a double gate FET, a sample was evaluated using a new condition M.

The condition M was such that the $AsH_3$ concentration in the material gas was 0.14% by mass, the He concentration was 99.86% by mass, and the total flow rate of a combination of He and $AsH_3$ was 800 cm$^3$/min (standard state). This condition is equal to a situation where the supply of $AsH_3$ molecules per unit time and per unit volume is $3.26\times10^{-7}$ mol/(min·L·sec), and the supply of He atoms per unit time and per unit volume is $4.66\times10^{-3}$ mol/(min·L·sec). Furthermore, the condition M is such that the material gas is $AsH_3$ diluted with He, the source power (the plasma-generating high-frequency power) is 500 W, the bias voltage Vpp is 250 V, the substrate temperature is 22° C., the plasma doping time is 60 seconds, the chamber volume is 93 L, and the internal chamber pressure is 1.2 Pa.

The sample was subjected to plasma doping under the condition M described above, and then subjected to annealing (specifically, spike RTA at 1025° C.), and thereafter, the spreading resistance and erosion on a fin corner portion were measured by SSRM and SEM observation, respectively. Furthermore, the flat principal surface of a silicon substrate was subjected to plasma doping using the condition M separately, the silicon substrate was then subjected to annealing (specifically, spike RTA at 1025° C.), and thereafter, the sheet resistance was measured using a four-point probe technique.

Consequently, under the condition M, the sheet resistance, the spreading resistance of the fin top surface, the spreading resistance of a fin side surface, and the amount of increase in the radius of curvature of a fin corner portion were obtained as described below.

Specifically, under the condition M, the sheet resistance was 348 Ω/sq., the spreading resistance of the fin top surface was $3.4\times10^{3}$Ω, the spreading resistance of the fin side surface was $2.9\times10^{3}$Ω, and the amount of increase in the radius of curvature of the fin corner portion was 11.8 nm.

Here, it should be noted that the spreading resistance of the fin side surface is lower than the spreading resistance of the fin top surface. The supply of $AsH_3$ molecules per unit time and per unit volume under the condition M is $3.26\times10^{-7}$ mol/(min·L·sec), and this value is at a level between the supply of $AsH_3$ molecules per unit time and per unit volume under the condition E and the supply of $AsH_3$ molecules per unit time and per unit volume under the condition I. When the supply of He atoms per unit time and per unit volume is set at $3.59\times10^{-3}$ mol/(min·L·sec) equal to that under each of the conditions E and I with the above supply of $AsH_3$ molecules per unit time and per unit volume employed, the spreading resistance of a fin side surface is reduced only to approximately $1\times10^{4}$-$2\times10^{4}$Ω. By contrast, under the condition M, the supply of He atoms was increased to $4.66\times10^{-3}$ mol/(min·L·sec), which is approximately 30% greater than under each of the conditions E and I. This enabled a significant reduction in the spreading resistance of a fin side surface to $2.9\times10^{3}$Ω. However, erosion is increased to 11.8 nm as described above. Also in this case, when, in a double gate FET, the thickness of a hard mask covering the fin top surface is set at, e.g., approximately 30 nm, this can prevent fin-type semiconductor regions themselves from being chipped.

Therefore, when a double gate FET is formed, the supply of He atoms per unit time and per unit volume may be set at $4.66\times10^{-3}$ mol/(min·L·sec).

However, when the supply of He atoms per unit time and per unit volume is set at $4.66\times10^{-3}$ mol/(min·L·sec), the spreading resistance of a fin side surface has already reached a lower level than the spreading resistance of the fin top surface. Therefore, even when the supply of He atoms per unit time and per unit volume is greater than $4.66\times10^{-3}$ mol/(min·L·sec), a further reduction in the spreading resistance of the fin side surface cannot be expected. Meanwhile, in this case, the following adverse effect occurs: erosion becomes large enough to fail to be prevented by a hard mask covering the fin top surface of a double gate FET.

As described above, when a double gate FET is formed, the supply of He atoms per unit time and per unit volume is preferably set less than or equal to $4.66\times10^{-3}$ mol/(min·L·sec).

Although a case where the chamber volume is 93 L was described above as an example, a case where the chamber volume is 37 L will be described below as an example.

In this case, the supply of He atoms per unit time and per unit volume allowing the internal chamber pressure to be 0.6 Pa is $2.7\times10^{-2}$ mol/(min·L·sec). Specifically, when the chamber volume is 37 L, erosion can be reduced to a low level of less than or equal to 4 nm, by setting the supply of He atoms per unit time and per unit volume at $2.7\times10^{-2}$ mol/(min·L·sec) or less.

When the chamber volume is small, the gas residence time increases even with an increase in the internal chamber pressure unless the exhaust capacity of the chamber is increased. This makes it difficult to significantly increase the supply of He atoms. For example, when the chamber volume is 37 L, and the internal chamber pressure is set at 0.9 Pa, the supply of He atoms is substantially greatest, i.e., $2.84\times10^{-2}$ mol/(min·L·sec). In this case, the spreading resistance of a fin side surface is lowest. Furthermore, even when the adjustment of the exhaust capacity of the chamber, etc., can slightly increase the supply of He atoms, the supply of He atoms can be increased only up to $3\times10^{-2}$ mol/(min·L·sec). Therefore, when a double gate FET is formed, the supply of He atoms per unit time and per unit volume is preferably less than or equal to $3\times10^{-2}$ mol/(min·L·sec). In order to allow the supply of He atoms per unit time and per unit volume to be greater than $3\times10^{-2}$ mol/(min·L·sec), an increase in the size of an exhaust pump, etc., is required, thereby causing a problem where the size of a system increases.

While the upper limit of the supply of He atoms is dependent on the chamber volume, it is efficient to generally use a value in the chamber volume range of greater than or equal to 30 L and less than or equal to 100 L as the chamber volume for use in plasma doping assumed in this embodiment. When the chamber volume is less than 30 L, and a 300-mm-diameter wafer is placed in the chamber, the inside diameter of the chamber is approximately equal to the diameter of the wafer. This causes nonuniform gas flow, and thus, the dose tends to significantly vary across the wafer surface. By contrast, when the chamber volume is greater than 100 L, the chamber volume is too large to be economically efficient.

Based on such a chamber volume range, it is seen from the above description that when a double gate FET is formed using a chamber having a relatively small volume (greater than or equal to 30 L and less than or equal to 65 L) in this embodiment, the supply of He atoms per unit time and per unit volume is preferably set less than or equal to $3 \times 10^2$ mol/(min·L·sec). Here, similarly to the above section "Influence of Source Power on Threshold Supply of $AsH_3$ Molecules and Threshold Supply of He Atoms," in consideration of the source power dependence, when the source power is Y (W), the supply of He atoms per unit time and per unit volume is preferably set less than or equal to $3 \times 10^{-2}/((20^{2.51}/2^{4.51}) \times (Y/500))$ mol/(min·L·sec).

When a triple gate FET is formed using a chamber having a relatively small volume (greater than or equal to 30 L and less than 65 L), the supply of He atoms per unit time and per unit volume is preferably set less than or equal to $2.7 \times 10^{-2}$ mol/(min·L·sec). Here, similarly to the above section "Influence of Source Power on Threshold Supply of $AsH_3$ Molecules and Threshold Supply of He Atoms," in consideration of the source power dependence, when the source power is Y (W), the supply of He atoms per unit time and per unit volume is preferably set less than or equal to $2.7 \times 10^{-2}/((20^{2.51}/2^{4.51}) \times (Y/500))$ mol/(min·L·sec).

When a double gate FET is formed using a chamber having a relatively large volume (greater than or equal to 65 L and less than or equal to 100 L), the supply of He atoms per unit time and per unit volume is preferably set less than or equal to $4.66 \times 10^{-3}$ mol/(min·L·sec). Here, similarly to the above section "Influence of Source Power on Threshold Supply of $AsH_3$ Molecules and Threshold Supply of He Atoms," in consideration of the source power dependence, when the source power is Y (W), the supply of He atoms per unit time and per unit volume is preferably set less than or equal to $4.66 \times 10^{-3}/((20^{2.51}/2^{4.51}) \times (Y/500))$ mol/(min·L·sec).

When a triple gate FET is formed using a chamber having a relatively large volume (greater than or equal to 65 L and less than or equal to 100 L), the supply of He atoms per unit time and per unit volume is preferably set less than or equal to $3.8 \times 10^{-3}$ mol/(min·L·sec). Here, similarly to the above section "Influence of Source Power on Threshold Supply of $AsH_3$ Molecules and Threshold Supply of He Atoms," in consideration of the source power dependence, when the source power is Y (W), the supply of He atoms per unit time and per unit volume is preferably set less than or equal to $3.8 \times 10^{-3}/((20^{2.51}/2^{4.51}) \times (Y/500))$ mol/(min·L·sec).

What is claimed is:

1. A method for fabricating a semiconductor device, the method comprising:
   forming a fin-type semiconductor region on a substrate; and
   introducing an n-type impurity into at least a side of the fin-type semiconductor region by a plasma doping process, thereby forming an n-type impurity region in the side of the fin-type semiconductor region,
   wherein in the introducing the n-type impurity, when a source power in the plasma doping process is denoted by a character Y [W], a supply of a gas containing the n-type impurity per unit time and per unit volume is set greater than or equal to $5.1 \times 10^{-8}/((1.7^{2.51}/2^{4.51}) \times (Y/500))$ [mol/(min·L·sec)], and a supply of a diluent gas per unit time and per unit volume is set greater than or equal to $1.7 \times 10^{-4}/((20^{2.51}/2^{4.51}) \times (Y/500))$ [mol/(min·L·sec)].

2. The method of claim 1, wherein
in the introducing the n-type impurity, the supply of the gas containing the n-type impurity per unit time and per unit volume is set greater than or equal to $7 \times 10^{-8}/((1.7^{2.51}/2^{4.51}) \times (Y/500))$ [mol/(min·L·sec)], and the supply of the diluent gas per unit time and per unit volume is set greater than or equal to $1.7 \times 10^{-3}/((20^{2.51}/2^{4.51}) \times (Y/500))$ [mol/(min·L·sec)].

3. The method of claim 2, wherein
in the introducing the n-type impurity, the supply of the gas containing the n-type impurity per unit time and per unit volume is set greater than or equal to $8.7 \times 10^{-8}/((1.7^{2.51}/2^{4.51}) \times (Y/500))$ [mol/(min·L·sec)], and the supply of the diluent gas per unit time and per unit volume is set greater than or equal to $3.4 \times 10^{-3}/((20^{2.51}/2^{4.51}) \times (Y/500))$ [mol/(min·L·sec)].

4. The method of claim 1, wherein
in the introducing the n-type impurity, the supply of the gas containing the n-type impurity per unit time and per unit volume is set less than $9.66 \times 10^{-6}/((1.7^{2.51}/2^{4.51}) \times (Y/500))$ [mol/(min·L·sec)].

5. The method of claim 1, wherein
in the introducing the n-type impurity, a chamber volume is greater than or equal to 30 liters and less than 65 liters, and the supply of the diluent gas per unit time and per unit volume is set less than or equal to $3 \times 10^{-2}/((20^{2.51}/2^{4.51}) \times (Y/500))$ [mol/(min·L·sec)].

6. The method of claim 1, wherein
in the introducing the n-type impurity, a chamber volume is greater than or equal to 65 liters and less than or equal to 100 liters, and the supply of the diluent gas per unit time and per unit volume is set less than or equal to $4.66 \times 10^{-3}/((20^{2.51}/2^{4.51}) \times (Y/500))$ [mol/(min·L·sec)].

7. The method of claim 1, wherein
in the introducing the n-type impurity, a pressure during the plasma doping process is set less than or equal to 0.6 Pa.

8. The method of claim 1, wherein
the gas containing the n-type impurity is $AsH_3$.

9. The method of claim 1, wherein
the diluent gas is He.

10. The method of claim 1, wherein
the n-type impurity region is an extension region or a source/drain region.

11. The method of claim 1, wherein
a width of the fin-type semiconductor region along a gate width is less than or equal to 15 nm.

* * * * *